United States Patent
Tanabe

(10) Patent No.: US 9,558,838 B2
(45) Date of Patent: Jan. 31, 2017

(54) SEMICONDUCTOR DEVICE FOR MASKING DATA STORED IN TWIN CELL AND OUTPUTTING MASKED DATA

(71) Applicant: Renesas Electronics Corporation, Tokyo (JP)

(72) Inventor: Kenji Tanabe, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/910,645

(22) PCT Filed: Aug. 22, 2013

(86) PCT No.: PCT/JP2013/072359
§ 371 (c)(1),
(2) Date: Feb. 5, 2016

(87) PCT Pub. No.: WO2015/025391
PCT Pub. Date: Feb. 26, 2015

(65) Prior Publication Data
US 2016/0180948 A1    Jun. 23, 2016

(51) Int. Cl.
*G11C 16/06*     (2006.01)
*G11C 16/26*     (2006.01)
(Continued)

(52) U.S. Cl.
CPC .......... *G11C 16/26* (2013.01); *G11C 16/0475* (2013.01); *G11C 16/08* (2013.01); *G11C 16/24* (2013.01)

(58) Field of Classification Search
CPC ......... G11C 16/08; G11C 16/24; G11C 16/26; G11C 16/0475; G11C 16/28; G11C 16/0441; G11C 7/04
(Continued)

(56) References Cited

U.S. PATENT DOCUMENTS 6,987,690 B2 *   1/2006  Hidaka .................. G11C 11/16
                                                365/161
7,646,642 B2 *   1/2010  Fujito ..................... G11C 7/04
                                              365/185.02
(Continued)

FOREIGN PATENT DOCUMENTS

JP    2008-117510 A    5/2008
JP    2009-272028 A    11/2009

OTHER PUBLICATIONS

International Search Report (ISR) (PCT Form PCT/ISA/210), in PCT/JP2013/072359, dated Nov. 19, 2013.

*Primary Examiner* — Gene Auduong
(74) *Attorney, Agent, or Firm* — McGinn IP Law Group, PLLC

(57) ABSTRACT

A memory array includes a plurality of twin cells, each of the twin cells composed of a first storage element and a second storage element configured to hold binary data according to a difference in threshold voltage between them, the first storage element and the second storage element each being electrically rewritable. Upon receiving a request to read the twin cell, when the threshold voltage of the first storage element forming the twin cell is lower than an erasure determination level and the threshold voltage of the second storage element forming the twin cell is lower than the erasure determination level, an output circuit masks the data stored in the twin cell and outputs the masked data.

11 Claims, 15 Drawing Sheets

(51) Int. Cl.
*G11C 16/04* (2006.01)
*G11C 16/08* (2006.01)
*G11C 16/24* (2006.01)

(58) Field of Classification Search
USPC ..... 365/185.21, 185.18, 185.05, 185.02, 190
See application file for complete search history.

(56) References Cited

U.S. PATENT DOCUMENTS

| | | | | |
|---|---|---|---|---|
| 7,957,195 | B2* | 6/2011 | Fujito | G11C 7/04 365/185.05 |
| 8,144,518 | B2* | 3/2012 | Fujito | G11C 7/04 365/185.05 |
| 2008/0089146 | A1 | 4/2008 | Fujito et al. | |
| 2009/0254696 | A1 | 10/2009 | Kasai et al. | |
| 2016/0064095 | A1* | 3/2016 | Kato | G11C 16/28 365/185.21 |
| 2016/0180941 | A1* | 6/2016 | Kato | G11C 16/06 365/185.29 |
| 2016/0189057 | A1* | 6/2016 | Rao | G06N 99/005 706/12 |
| 2016/0260486 | A1* | 9/2016 | Tani | G11C 16/14 |

\* cited by examiner

FIG.5
(a)
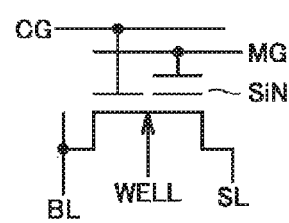
| | BL | CG | MG | SL | WELL | |
|---|---|---|---|---|---|---|
| READ | 1.5V | 1.5V | 0V | 0V | 0V | |
| RAISE Vth | 0V | 1.5V | 10V | 6V | 0V | (FOR EACH BIT) |
| LOWER Vth | Hi-Z | 1.5V | -10V | 6V | 0V | (BATCH) |
(b)
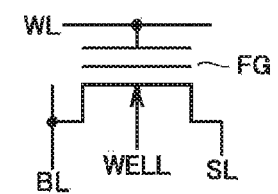
| | BL | WL | SL | WELL | |
|---|---|---|---|---|---|
| READ | 1.5V | 1.5V | 0V | 0V | |
| RAISE Vth | 8V | 10V | 0V | 0V | (FOR EACH BIT) |
| LOWER Vth | 10V | -10V | 10V | 10V | (BATCH) |
(c)
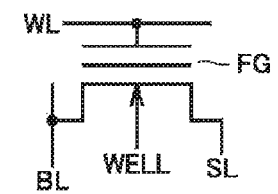
| | BL | WL | SL | WELL | |
|---|---|---|---|---|---|
| READ | 1.5V | 1.5V | 0V | 0V | |
| RAISE Vth | -10V | 10V | -10V | -10V | (FOR EACH BIT) |
| LOWER Vth | 10V | -10V | 0V | 0V | (BATCH) |

SEMICONDUCTOR DEVICE FOR MASKING DATA STORED IN TWIN CELL AND OUTPUTTING MASKED DATA

TECHNICAL FIELD

The present invention relates to semiconductor devices, for example, a semiconductor device including a nonvolatile memory.

BACKGROUND ART

Conventionally, there has been known a semiconductor nonvolatile memory in which complementary data are written to two memory cells, which has a blank check function.

For example, a semiconductor integrated circuit described in Japanese Patent Laying-Open No. 2009-272028 (PTD 1) is provided with a nonvolatile memory (DFL; 21) including a plurality of twin cells, a selector (SEL_BC), and a sense circuit (BC_SA). Complementary data are written to two nonvolatile memory cells (MC1, MC2) of each twin cell, to set the memory cells in a written state where one of the cells is set to low threshold voltage and the other cell is set to high threshold voltage. Non-complementary data are written (which is referred to as erasure) to the two nonvolatile memories (MC1, MC2), to set the memories in a blank state where both memories are set to low threshold voltage. The selector (SEL_BC) includes a plurality of switching elements. During a blank check operation, switching elements of the selector (SEL_BC) are controlled to be in an ON state, and a first total current of the twin cells commonly flowing to a first input terminal of the sense circuit is compared with a reference signal of a second input terminal, thereby detecting at high speed whether the plurality of twin cells are in the written state or in the blank state.

CITATION LIST

Patent Document

PTD 1: Japanese Patent Laying-Open No. 2009-272028

SUMMARY OF INVENTION

Technical Problem

However, although both threshold voltages of the two nonvolatile memories (MC1, MC2) can be lowered by the erasure, the possibility cannot be denied that the magnitude relation between the threshold voltages of the two nonvolatile memories in the written state before the erasure will be maintained even after the erasure.

In consequence, the same data as the one that had been written before the erasure may be read in read operation, even though the data was erased, which may result in security problems.

Other objects and novel features will become apparent from the description herein and the accompanying drawings.

Solution to Problem

In a semiconductor device of one embodiment of the present invention, upon receiving a request to read a twin cell, when a threshold voltage of a first storage element forming the twin cell is lower than an erasure determination level and a threshold voltage of a second storage element forming the twin cell is lower than the erasure determination level, an output circuit masks data stored in the twin cell and outputs the masked data.

Advantageous Effects of Invention

According to one embodiment of the present invention, reading of data that had been written before erasure, even though the data was erased, can be prevented.

BRIEF DESCRIPTION OF DRAWINGS

FIG. 5(a) is a diagram illustrating an example of a bias voltage applied to a split-gate flash memory device. FIG. 5(b) is a diagram illustrating an example of a bias voltage applied to a stacked-gate flash memory device employing hot carrier writing. FIG. 5(c) is a diagram illustrating an example of a bias voltage applied to a stacked-gate flash memory device employing FN tunnel writing.

DESCRIPTION OF EMBODIMENTS

Embodiments of the present invention will be described with reference to the drawings.

[First Embodiment]

Figure 1:
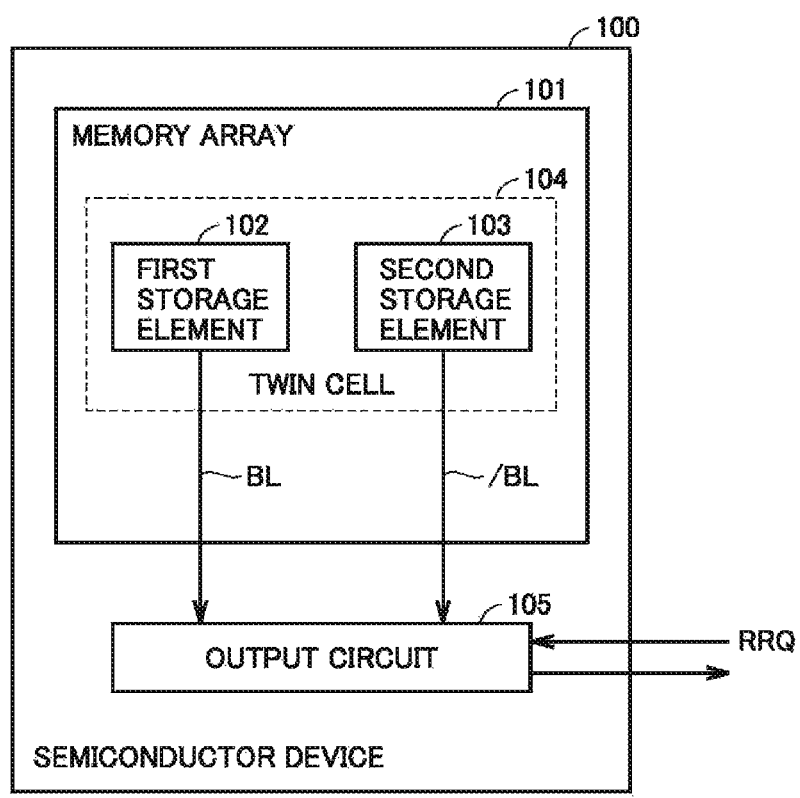
FIG. 1 is a diagram illustrating the configuration of a semiconductor device of a first embodiment.

FIG. 1 is a diagram illustrating the configuration of a semiconductor device of a first embodiment.

A semiconductor device 100 includes a memory array 101 and an output circuit 105.

Memory array 101 includes a plurality of twin cells 104. Each of twin cells 104 is composed of a first storage element 102 and a second storage element 103 configured to hold binary data (twin cell data) according to a difference in a threshold voltage Vth between them, the first storage element and the second storage element each being electrically rewritable.

Upon receiving a request to read twin cell 104, when threshold voltage Vth of first storage element 102 is lower than an erasure determination level and threshold voltage Vth of second storage element 103 is lower than the erasure determination level, output circuit 105 outputs data obtained by masking the data stored in twin cell 104. The masked data is, for example, a value independent of the value of the data stored in twin cell 104, and is a fixed value "1" or "0", or a random value. The erasure determination level as used herein is a prescribed voltage level that can be distinguished from a state where the memory cell has a high threshold value after write, and does not particularly need to be the same voltage value as an erasure determination level used during operation of erasing the twin cell or erasing each memory cell, but may be a similar voltage value.

Figure 2:
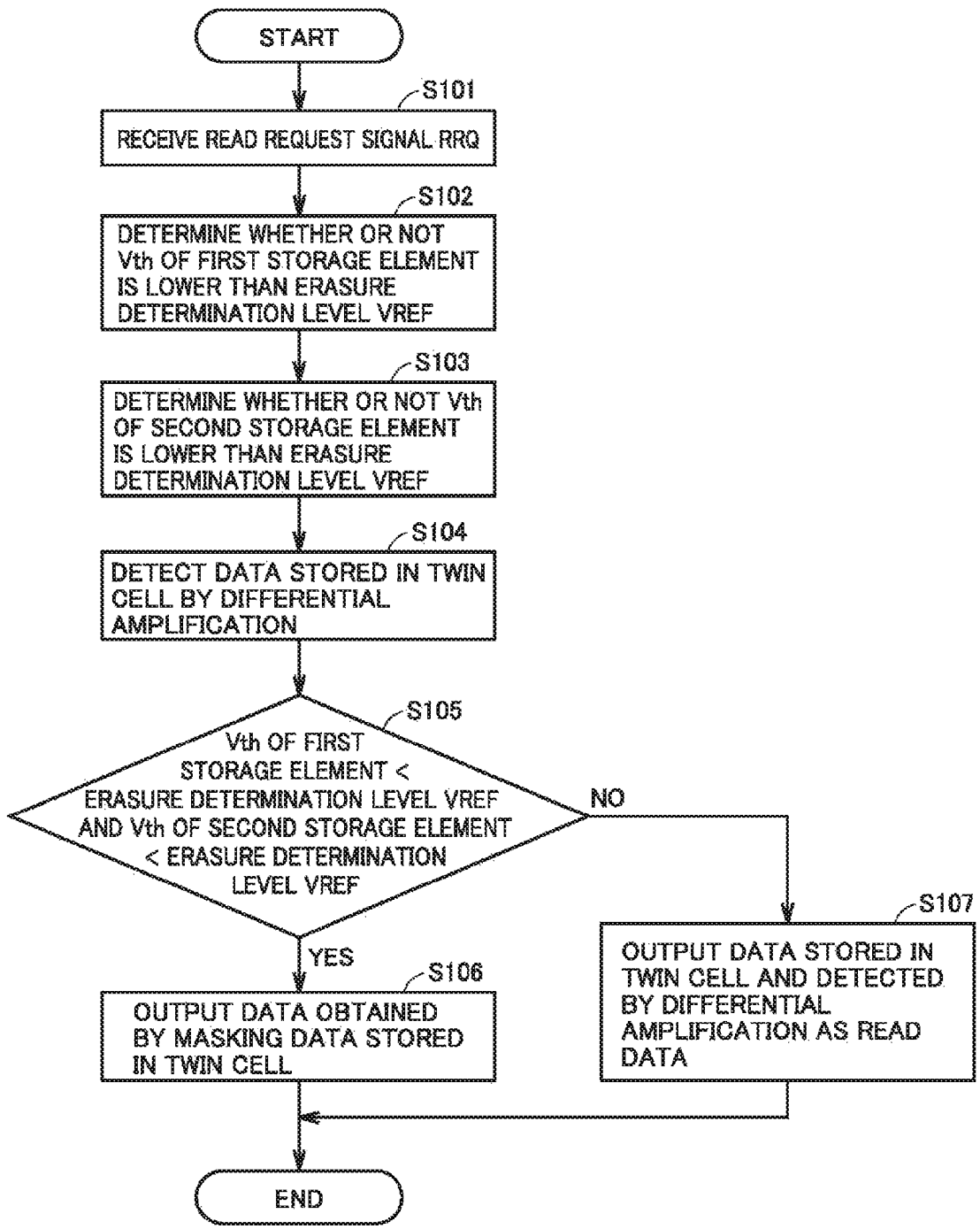
FIG. 2 is a flowchart illustrating a procedure of reading twin cell data from a memory array in the semiconductor device of the first embodiment.

FIG. 2 is a flowchart illustrating a procedure of reading the twin cell data from memory array 101 in the semiconductor device of the first embodiment.

First, output circuit 105 receives a twin cell data read request signal RRQ (step S101).

Then, output circuit 105 determines whether or not threshold voltage Vth of first storage element 102 is lower than an erasure determination level VREF by reading data stored in first storage element 102 through a bit line BL (step S102).

Then, output circuit 105 determines whether or not threshold voltage Vth of second storage element 103 is lower than erasure determination level VREF by reading data stored in second storage element 103 through a bit line /BL (step S103).

Then, output circuit 105 detects data stored in twin cell 104 by differential amplification between the pair of bit lines BL and /BL (step S104).

When threshold voltage Vth of first storage element 102 is lower than erasure determination level VREF and threshold voltage Vth of second storage element 103 is lower than erasure determination level VREF (YES in step S105), output circuit 105 outputs data obtained by masking the data stored in twin cell 104, as read data (step S106).

When threshold voltage Vth of first storage element 102 is higher than or equal to erasure determination level VREF or threshold voltage Vth of second storage element 103 is higher than or equal to erasure determination level VREF (NO in step S105), output circuit 105 outputs the data stored in twin cell 104 and detected by the differential amplification between the pair of bit lines BL and /BL, as read data (step S107).

As described above, according to this embodiment, when the threshold voltages of the two storage elements forming the twin cell are lower than the erasure determination level, the data stored in the twin cell is masked, thereby preventing reading of data written before erasure.

[Second Embodiment]

A semiconductor device of this embodiment is a microcomputer.

(Microcomputer)

Figure 3:
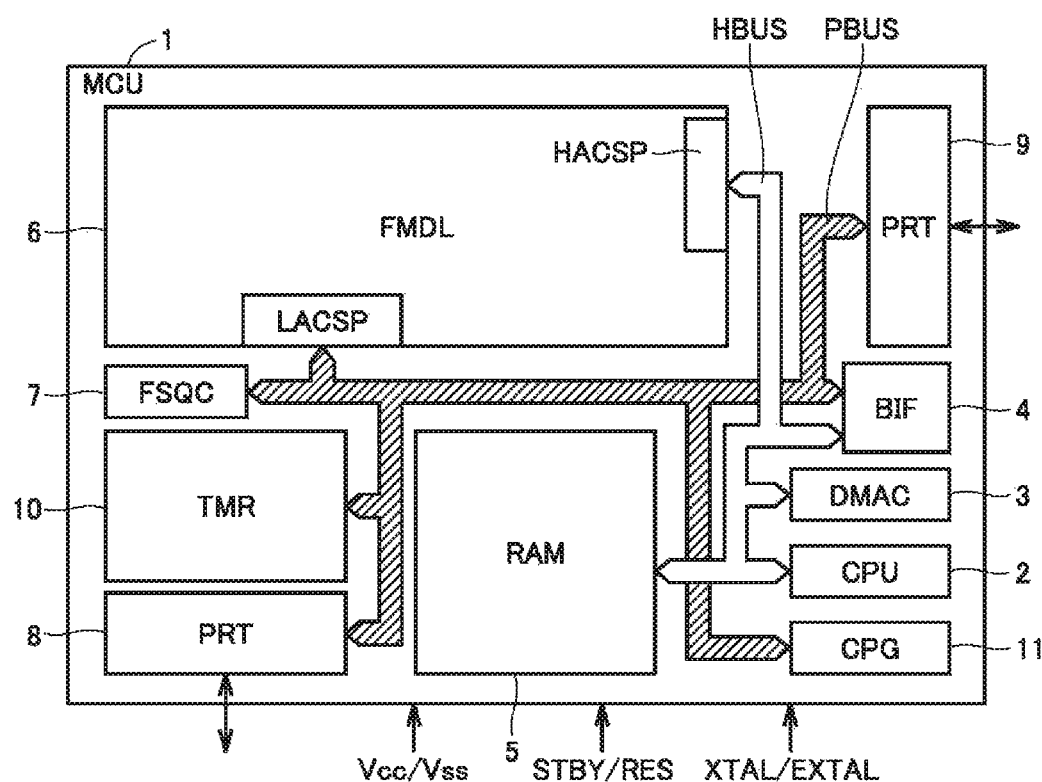
FIG. 3 is a diagram illustrating the configuration of a microcomputer of a second embodiment.

FIG. 3 is a diagram illustrating the configuration of a microcomputer 1 of a second embodiment.

Microcomputer (MCU) 1 shown in FIG. 3 is formed into a single semiconductor chip such as single crystal silicon by a technique of manufacturing a complementary MOS integrated circuit, for example.

Although not particularly limited, microcomputer 1 has a high-speed bus HBUS and a peripheral bus PBUS. Although not particularly limited, high-speed bus HBUS and peripheral bus PBUS each have a data bus, an address bus and a control bus. By providing the two buses, a load on each bus can be reduced as compared to the case where all circuits are commonly connected to a common bus, thereby ensuring high-speed access operation.

High-speed bus HBUS is connected to a central processing unit (CPU) 2 including an instruction control unit and an execution unit and configured to execute an instruction, a direct memory access controller (DMAC) 3, and a bus interface circuit (BIF) 4 configured to perform bus interface control or bus bridge control of high-speed bus HBUS and peripheral bus PBUS.

High-speed bus HBUS is further connected to a random access memory (RAM) 5 used for a work area of central processing unit 2 or the like, and a flash memory module (FMDL) 6 serving as a nonvolatile memory module configured to store data and programs.

Peripheral bus PBUS is connected to a flash sequencer (FSQC) 7 configured to perform command access control on flash memory module (FMDL) 6, external input/output ports (PRTs) 8 and 9, a timer (TMR) 10, and a clock pulse generator (CPG) 11 configured to generate an internal clock CLK for controlling microcomputer 1.

Microcomputer 1 further includes a clock terminal which is connected to an oscillator at XTAL/EXTAL or to which an external clock is supplied, an external hardware standby terminal STBY to indicate a standby state, an external reset terminal RES to indicate reset, an external power supply terminal Vcc, and an external ground terminal Vss.

Although flash sequencer 7 serving as a logic circuit and flash memory module 6 arranged as an array are herein designed using different CAD tools and are thus illustrated as separate circuit blocks for convenience, they are combined together to form a single flash memory. Flash memory module 6 is connected to high-speed bus HBUS through a read-only high-speed access port (HACSP). The CPU or the DMAC can have a read access to flash memory module 6 from high-speed bus HBUS through the high-speed access port. When making a write access and an initialization access to flash memory module 6, CPU 2 or DMAC 3 issues a command to flash sequencer 7 through bus interface 4 via peripheral bus PBUS, causing flash sequencer 7 to perform control of the initialization and write operation of the flash memory module from peripheral bus PBUS through a low-speed access port (LACSP).

(Flash Memory Module)

Figure 4:
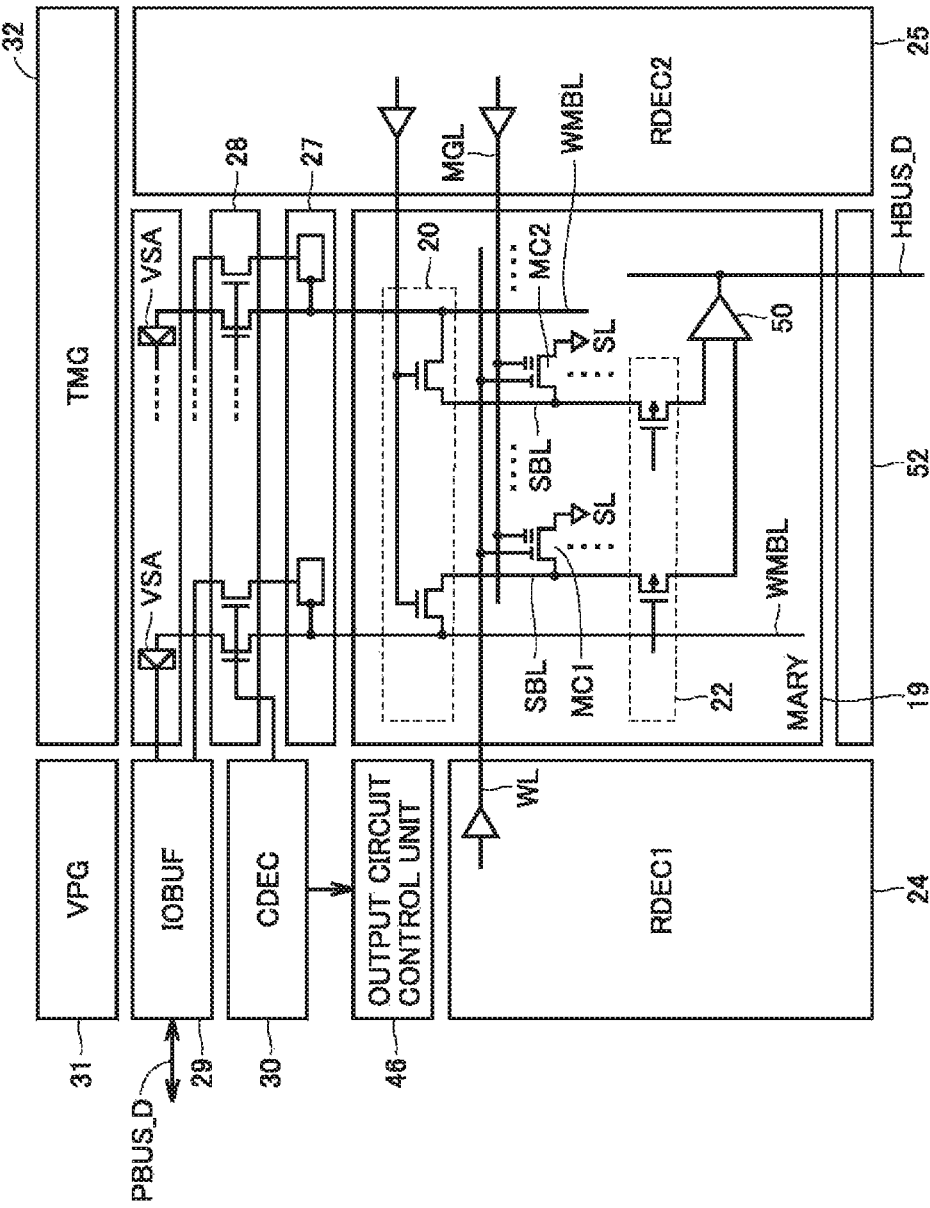
FIG. 4 is a diagram illustrating the configuration of a flash memory module.

FIG. 4 is a diagram illustrating the configuration of flash memory module 6.

Flash memory module 6 uses two nonvolatile memory cells to store one bit of information. That is, a memory array (MARY) 19 includes a plurality of one-bit twin cells each including two nonvolatile memory cells MC1 and MC2 which are each rewritable. Only one pair is representatively shown in FIG. 3. Memory cell MC1 is herein referred to as a positive cell, and memory cell MC2 as a negative cell. Of course, flash memory module 6 may include a plurality of memory cells in which one nonvolatile memory cell is used to store one bit of information. In such a case, the memory cells are often disposed separately in flash memory module 6 by the memory array or by the memory block divided into smaller units than the memory arrays.

Nonvolatile memory cells MC1 and MC2 are, for example, split-gate flash memory devices illustrated in FIG. 5(a). This memory device has a control gate CG and a memory gate MG disposed on a channel forming region between source and drain regions with a gate insulating film interposed therebetween. A charge trapping region (SiN) made of silicon nitride or the like is disposed between memory gate MG and the gate insulating film. The source or drain region on the select gate side is connected to a bit line BL, while the source or drain region on the memory gate MG side is connected to a source line SL.

To lower threshold voltage Vth of the memory cell, conditions of BL=Hi-Z (high impedance state), CG=1.5 V, MG=−10 V, SL=6V, and WELL=0 V are satisfied, whereby electrons are drawn from the charge trapping region (SiN) to a well region (WELL) by a high electric field between the well region (WELL) and memory gate MG. The unit of this process is a plurality of memory cells sharing the memory gate.

To raise threshold voltage Vth of the memory cell, conditions of BL=0 V, CG=1.5 V, MG=10 V, SL=6V, and WELL=0 V are satisfied, and a write current is passed from source line SL to the bit line, whereby hot electrons generated at the boundary between the control gate and the memory gate are injected into the charge trapping region (SiN). Since the injection of electrons depends on whether or not to pass the bit line current, this process is controlled by the bit.

A read is performed under conditions of BL=1.5 V, CG=1.5 V, MG=0 V, SL=0 V, and WELL=0V. The memory cell is turned on when threshold voltage Vth of the memory cell is low, and is turned off when threshold voltage Vth is high.

The memory device is not limited to the split-gate flash memory device, but may be a stacked-gate flash memory device illustrated in FIG. 5(*b*) and FIG. 5(*c*). This memory device is formed by stacking a floating gate FG and a control gate WL on a channel forming region between source and drain regions with a gate insulating film interposed therebetween. In FIG. 5(*b*), threshold voltage Vth is raised by hot carrier writing, and threshold voltage Vth is lowered by emission of electrons into well region WELL. In FIG. 5(*c*), threshold voltage Vth is raised by FN tunnel writing, and threshold voltage Vth is lowered by emission of electrons into bit line BL.

The following description is given on the assumption that the memory device is a split-gate flash memory device.

The storage of information in one twin cell composed of nonvolatile memory cells MC1 and MC2 is performed by storing complementary data in nonvolatile memory cells MC1 and MC2.

That is, each of memory cells MC1 and MC2 can hold cell data "1" (low threshold voltage state) or cell data "0" (high threshold voltage state).

The cell data "1" in the memory cell is a state where threshold voltage Vth of the memory cell is higher than or equal to erasure determination level VREF. The cell data "0" in the memory cell is a state where threshold voltage Vth of the memory cell is lower than erasure determination level VREF.

Figure 6:
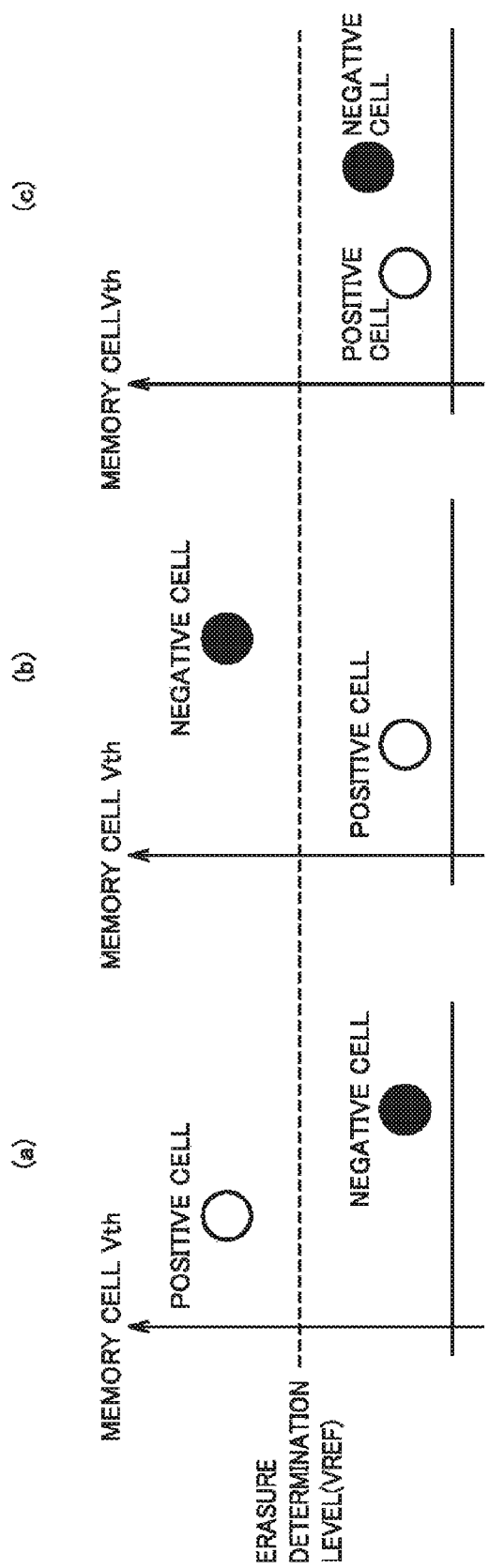
FIG. 6(a) is a diagram illustrating a state where the twin cell data stores "0".
FIG. 6(b) is a diagram illustrating a state where the twin cell data stores "1".
FIG. 6(c) is a diagram illustrating an initialized state of the twin cell data.

As shown in FIG. 6(*a*), twin cell data "0" is a state where positive cell MC1 holds the cell data "0" and negative cell MC2 holds the cell data "1". As shown in FIG. 6(*b*), twin cell data "1" is a state where positive cell MC1 holds the cell data "1" and negative cell MC2 holds the cell data "0". As shown in FIG. 6(*c*), a state where both positive cell MC1 and negative cell MC2 of the twin cell hold the cell data "1" is an initialized state, in which the twin cell data is variable.

When the twin cell data "0" is erased, both cells are put into the initial state. However, since threshold voltage Vth of positive cell MC1 is higher than threshold voltage Vth of negative cell MC2 before the erasure, there is a possibility that this relation will be maintained even after the erasure. When a read is performed in a state where this relation is maintained, since there is a difference in threshold voltage Vth between positive cell MC1 and negative cell MC2 even though they are in the initial state, data "0" which is substantially equal to the immediately preceding twin cell data "0" may be read rather than a variable value.

Likewise, when the twin cell data "1" is erased, both cells are put into the initial state. However, since threshold voltage Vth of negative cell MC2 is higher than threshold voltage Vth of positive cell MC1 before the erasure, there is a possibility that this relation will be maintained even after the erasure. When a read is performed in a state of this immediately preceding twin cell data, since there is a difference in threshold voltage Vth between positive cell MC1 and negative cell MC2 even though they are in the initial state, data "1" which is substantially equal to the immediately preceding twin cell data "1" may be read rather than as a variable value.

If data which is equal to the immediately preceding twin cell data may be read with a high probability in this manner rather than a variable value defining uncertain data, even though the data was erased, security problems will arise. An object of the embodiments of the present invention is to solve such a potential problem.

In memory cells MC1 and MC2 of the twin cell representatively shown in FIG. 4, memory gates MG are connected to a common memory gate select line MGL, and control gates CG are connected to a common word line WL. Numerous twin cells are actually arranged in a matrix and connected to corresponding memory gate selection lines MGL and word lines WL by the array in a row direction.

Memory cells MC1 and MC2 are connected to a sub-bit line SBL by the column, and connected to a write system main bit line WMBL through a sub-bit line selector 20. A plurality of sub-bit lines SBL are hierarchized by sub-bit line selector 20 and connected to each write system main bit line WMBL. Each hierarchized unit in sub-bit line SBL is called a memory mat. Source line SL is connected to ground potential Vss. Sub-bit line SBL of memory cell MC1 is connected to one input terminal of a differential amplification unit 50 through a read column selector 22 by the memory mat. Sub-bit line SBL of memory cell MC2 is connected to the other input terminal of differential amplification unit 50 through read column selector 22 by the memory mat.

Word line WL is selected by a first row decoder (RDEC1) 24. Memory gate select line MGL and sub-bit line selector 20 are selected by a second row decoder (RDEC2) 25. The selection operation by first row decoder 24 and second row decoder 25 is performed in accordance with address information and the like supplied to the HACSP during a read access, and is performed in accordance with address information and the like supplied to the LACSP during a data write operation and initialization operation.

The output of differential amplification unit 50 is connected to a data bus HBUS_D (DBUS) of high-speed bus HBUS through a data output unit 52.

An output circuit control unit 46 generates and supplies signals for controlling differential amplification unit 50 and data output unit 52.

Write system main bit line WMBL is configured such that a write current selectively flows therethrough in accordance with latched data of a write data latch circuit 27. Write data latch circuit 27 is selected by a rewrite column selector 28. Rewrite system main bit line WMBL selected by rewrite column selector 28 is connected to a verify sense amplifier VSA. The output of verify sense amplifier VSA and write data latch circuit 27 are connected to an input/output circuit (IOBUF) 29 interfaced with a data bus (PBUS_D) of peripheral bus PBUS.

Rewrite column selector 28 is selected by a column decoder (CDEC) 30. The selection operation by column decoder 30 is performed in accordance with address information and the like supplied to the LACSP.

A power supply circuit (VPG) 31 generates various operating power supplies required for read, write and initialization.

A timing generator (TMG) 32 generates an internal control signal for defining internal operation timing in accordance with an access strobe signal supplied from CPU 2 or the like to the HACSP, an access command supplied from FSQC 7 to the LACSP, and the like.

A control unit of the flash memory is composed of FSQC 7 and timing generator 32.

(Read of Twin Cell Data)

Figure 7:
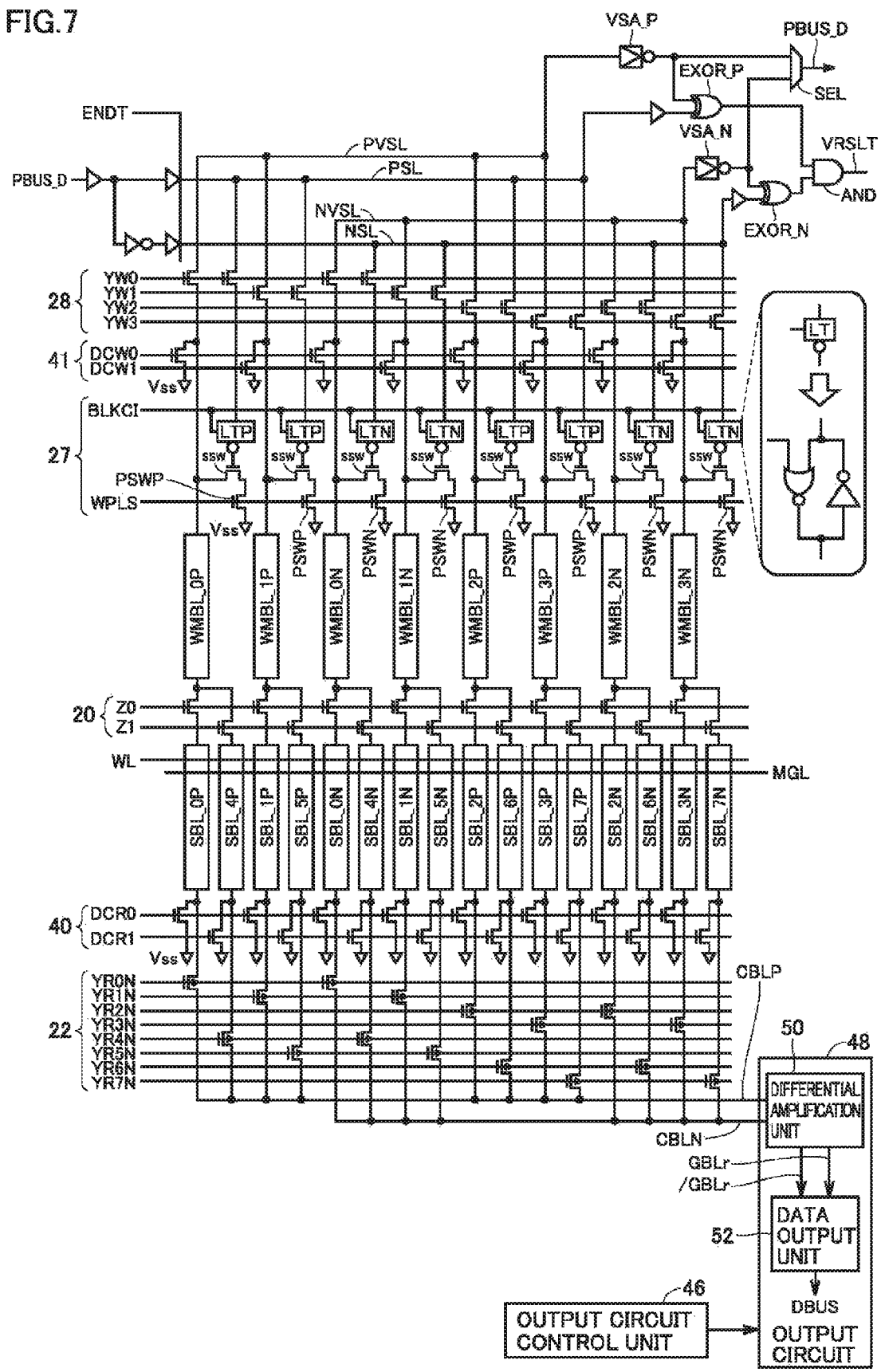
FIG. 7 is an example of a detailed circuit configuration of a read system and a write system for the twin cell data.

FIG. 7 illustrates a detailed circuit configuration of a read system and a write system for the twin cell data. Eight write system main bit lines WMBL_0P to WMBL_3P and WMBL_0N to WMBL_3N are illustrated, and a single memory mat is illustrated as a memory mat connected to these lines. Although not particularly limited, sub-bit lines SBL_0P to SBL_0P and SBL_0N to SBL_0N are disposed, where two sub-bit lines are allocated to each write system main bit line.

For memory cells MC1 and MC2, although not shown, the numeric suffix in each reference sign assigned to each sub-bit line represents the column number of a twin cell. The alphabetical suffix P means that the sub-bit line is connected to one memory cell MC1 (positive cell) of the twin cell, and the suffix N means that the sub-bit line is connected to the other memory cell MC2 (negative cell) of the twin cell. The alphabetical suffix P in each reference sign assigned to each write main bit line means that the write main bit line is connected to positive cell MC1 of the twin cell, the suffix N means that the write main bit line is connected to negative cell MC2 of the twin cell, and the numeric suffix means a smaller column number of the corresponding twin cell.

Read select signals YR0N to YR7N for controlling the switching of read column selector 22 select a pair of sub-bit lines with equal twin cell column numbers, connect the selected sub-bit line on the positive cell MC1 side to an output circuit 48 through a positive side common bit line CBLP, and connect the sub-bit line on the negative cell MC2 side to output circuit 48 through a negative side common bit line CBLN.

Upon receiving a request to read the twin cell data, output circuit 48 successively performs processes in a first mode, a second mode and a third mode. In the first mode, output circuit 48 performs a process for determining whether or not threshold voltage Vth of positive cell MC1 is lower than erasure determination level VREF. In the second mode, output circuit 48 performs a process for determining whether or not threshold voltage Vth of negative cell MC2 is lower than erasure determination level VREF. In the third mode, output circuit 48 determines the data stored in the twin cell (MC1, MC2). When threshold voltage Vth of positive cell MC1 is lower than erasure determination level VREF and threshold voltage Vth of negative cell MC2 is lower than erasure determination level VREF, output circuit 48 outputs data obtained by masking the determined data stored in the twin cell (MC1, MC2).

Output circuit 48 includes differential amplification unit 50 and data output unit 52.

In the first mode, differential amplification unit 50 amplifies the difference between a voltage generated on a first bit line in accordance with threshold voltage Vth of positive cell MC1 and a voltage generated on a second bit line upon connected to a constant current source.

In the third mode, differential amplification unit 50 amplifies the difference between a voltage generated on the second bit line in accordance with threshold voltage Vth of negative cell MC2 and a voltage generated on the first bit line upon connected to the constant current source.

In the second mode, differential amplification unit 50 amplifies the difference between a voltage generated on the first bit line in accordance with threshold voltage Vth of positive cell MC1 and a voltage generated on the second bit line in accordance with threshold voltage Vth of negative cell MC2.

The voltages of the first bit line and the second bit line are sent to data output unit 52 through a pair of global read bit lines GBLr and /GBLr, respectively.

Data output unit 52 receives the data of the pair of global read bit lines GBLr and /GBLr. Data output unit 52 stores data representing the result in the first mode, data representing the result in the second mode, and data representing the result in the third mode. When the result in the first mode shows that threshold voltage Vth of positive cell MC1 is lower than erasure determination level VREF, and the result in the second mode shows that threshold voltage Vth of negative cell MC2 is lower than erasure determination level VREF, data output unit 52 outputs data obtained by masking the result in the third mode.

Read system discharge circuit 40 is a circuit for selectively connecting sub-bit lines SBL to ground potential Vss based on discharge signals DCR0 and DCR1, and connects the sub-bit lines not selected by sub-bit line selector 20 to ground potential Vss.

(Write of Twin Cell Data)

Write data latch circuit 27 has static latches LTP and LTN having a reset function based on a signal BLKCI, current switches PSWP and PSWN for passing a write current in accordance with the pulse width of a write pulse WPLS, and write select switches SSW for selectively connecting the main bit lines and current switches PSWP and PSWN in accordance with the values of inversion storage nodes of static latches LT.

Write data supplied to a non-inverted signal line PSL from data bus PBUS_D is selected by rewrite column selector 28 and supplied to static latch LTP corresponding to the main bit lines allocated to positive cell MC1. Inverted write data supplied to an inverted signal line NSL from data bus PBUS_D is selected by rewrite column selector 28 and supplied to static latch LTN corresponding to the main bit lines allocated to negative cell MC2. ENDT is an input gate signal for write data to signal lines PSL and NSL.

The main bit lines allocated to positive cell MC1 are commonly connected to a non-inverted verify signal line PVSL through rewrite column selector 28. The main bit lines allocated to negative cell MC2 are commonly connected to a non-inverted verify signal line NVSL through rewrite column selector 28.

Write select signals YW0 to YW3 for controlling the switching of rewrite column selector 28 connect a pair of main bit lines with equal twin cell column numbers to signal lines PSL and NSL, and connect static latches LTP and LTN corresponding to the pair of main bit lines to signal lines PSL and NSL.

During write operation, write data input from data bus PBUS_D is input to signal lines PSL and NSL as complementary data, and latched by a pair of static latches LTP and LTN selected by rewrite column selector 28. One of static latches LTP and LTN latches data "1", and the other latches data "0". A write current from the source line does not flow through the main bit line corresponding to the latched data "1", whereas the write current from the source line flows through the main bit line corresponding to the latched data "0". Thereby, the cell data "0" is written to one of the memory cells of the selected twin cell, and the cell data "1" is written to the other memory cell.

During write verification, information stored in the twin cell for which the write operation has been selected is read to a corresponding pair of main bit lines, transmitted to verify signal lines PVSL and NVSL by rewrite column selector 28, and amplified by verify sense amplifiers VSA_P and VSA_N configured to provide an inverted amplified output with a single end. In addition, data held by static latches LTP and LTN where the write data has been stored during the write operation is likewise transmitted to signal lines PSL and NSL by rewrite column selector 28. A data written state of the positive cell can be verified by checking whether or not the output of verify sense amplifier VSA_P matches the non-inverted write data of signal line PSL by using an exclusive OR gate EXOR_P. Likewise, a data written state of negative cell MC2 can be verified by checking whether or not the output of verify sense amplifier VSA_N matches the inverted write data of signal line NSL by using an exclusive OR gate EXOR_N. A logical product of the outputs of exclusive OR gates EXPR_P and EXOR_N is obtained by an AND gate AND, and the result of the logical product serves as a write verify result VRSLT for one bit of write data. When write data has a plurality of bits, a logical product is obtained for all outputs of the exclusive OR gates corresponding to the plurality of bits to provide a verify result. Verify result VRSLT is supplied to flash sequencer 7.

The outputs of verify sense amplifiers VSA_P and VSA_N can be selectively output to peripheral data bus PBUS_D through a data selector SEL. This read path serves as a read path to amplify at a single end the information stored in negative cell MC2 of the twin cell or the information stored in positive cell MC1 of the twin cell and output the same to peripheral data bus PBUS_D.

A write system discharge circuit 41 is a circuit for selectively connecting write main bit lines WMBL to ground potential Vss based on discharge signals DCW0 and DCW1, and connects write main bit lines WBML not selected by rewrite column selector 28 to ground potential Vss.

(Differential Amplification Unit)

Figure 8:
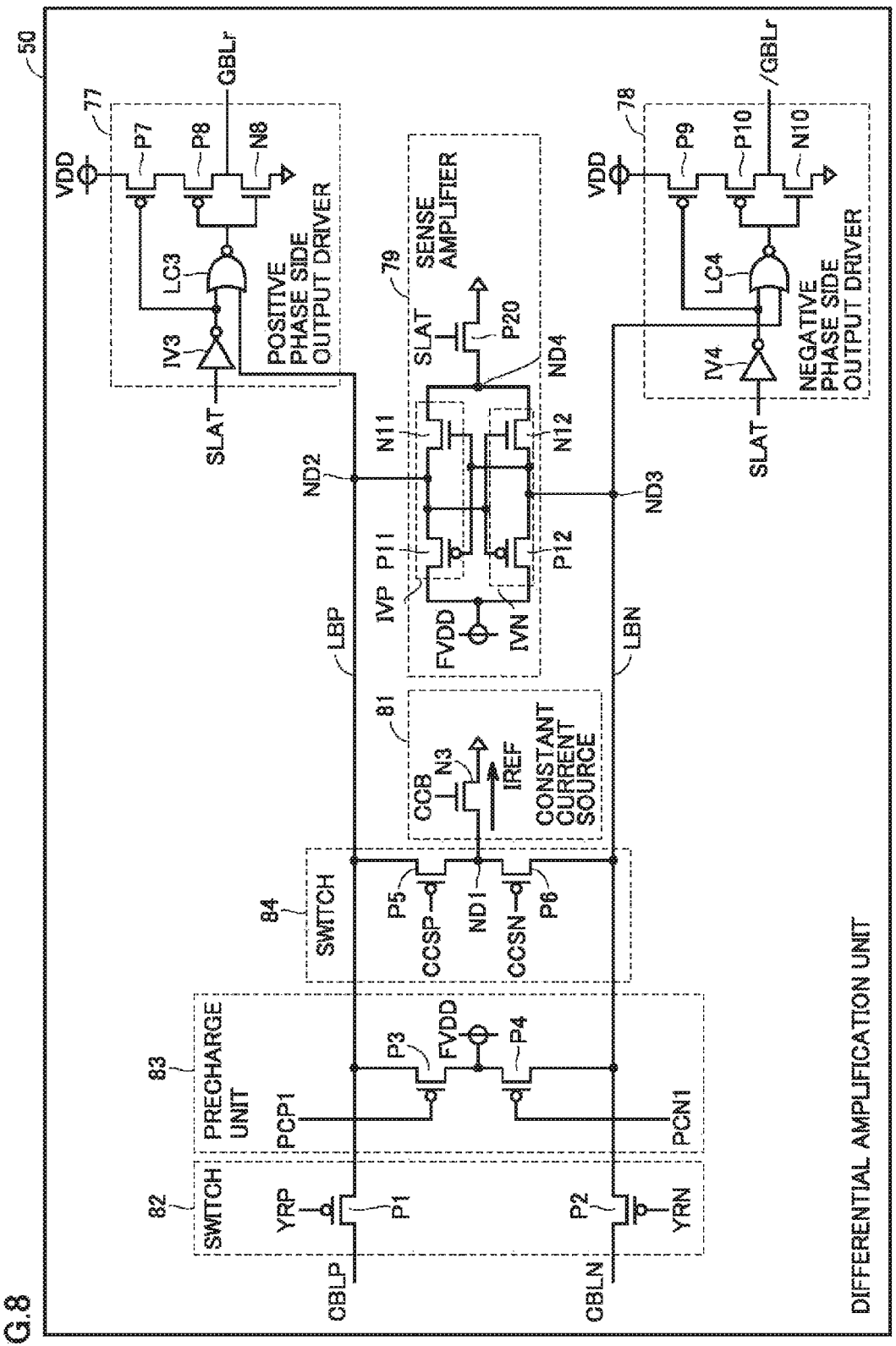
FIG. 8 is a diagram illustrating the configuration of a differential amplification unit.

FIG. 8 is a diagram illustrating the configuration of differential amplification unit 50.

Differential amplification unit 50 includes a switch 82, a precharge unit 83, a constant current source 81, a switch 84, a sense amplifier 79, a positive phase output driver 77, and a negative phase output driver 78.

Switch 82 includes P channel MOS (Metal-Oxide-Semiconductor) transistors P1 and P2.

P channel MOS transistor P1 is provided between one end of positive side common bit line CBLP and one end of a positive side local bit line (first bit line) LBP, and has a gate for receiving a positive side determination select signal YRP. P channel MOS transistor P2 is provided between one end of negative side common bit line CBLN and one end of a negative side local bit line LBN (second bit line), and has a gate for receiving a negative side determination select signal YRN.

Precharge unit 83 includes P channel MOS transistors P3 and P4.

P channel MOS transistor P3 is provided between positive side local bit line LBP and a power supply of a voltage FVDD, and has a gate for receiving a positive precharge signal PCP1. P channel MOS transistor P4 is provided between negative side local bit line LBN and the power supply of voltage FVDD, and has a gate for receiving a negative precharge signal PCN1.

Constant current source 81 includes a large-sized N channel MOS transistor N3. N channel MOS transistor N3 is provided between a node ND1 and a line of ground potential Vss, and has a gate for receiving a constant voltage CCB. When constant voltage CCB is supplied, a constant current IRRF flows through N channel MOS transistor N3.

The reason for providing constant current source 81 is described. When word line WL is set to a select level, a memory cell having threshold voltage Vth higher than or equal to erasure determination level VREF is turned off, and sub-bit line SBL connected to this memory cell maintains a precharge potential. When word line WL is set to the select level, on the other hand, a memory cell having threshold voltage Vth lower than erasure determination level VREF is turned on, and sub-bit line SBL connected to this memory cell discharges toward the ground potential. Accordingly, constant current source 81 is provided so that this difference can be detected as the potential difference on the bit lines by sense amplifier 79.

Switch 84 includes a P channel MOS transistor P5 and a P channel MOS transistor P6.

P channel MOS transistor P5 is provided between node ND1 and positive side local bit line LBP, and has a gate for receiving a positive phase side bias connection signal CCSP. P channel MOS transistor P6 is provided between node ND1 and negative side local bit line LBN, and has a gate for receiving a negative phase side bias connection signal CCSN.

In the first mode, positive side determination select signal YRP is activated to "L" level, negative side determination select signal YRN is deactivated to "H" level, positive phase side bias connection signal CCSP is deactivated to "H" level, and negative phase side bias connection signal CCSN is activated to "L" level. As a result, positive side local bit line LBP is connected to positive side common bit line CBLP, and further connected to a selected sub-bit line SBL_iP (third bit line) on the positive cell side, while negative side local bit line LBN is connected to constant current source 81.

In the second mode, positive side determination select signal YRP is deactivated to "H" level, negative side determination select signal YRN is activated to "L" level, positive phase side bias connection signal CCSP is activated to "L" level, and negative phase side bias connection signal CCSN is deactivated to "H" level. As a result, positive side local bit line LBP is connected to constant current source 81, negative side local bit line LBN is connected to negative side common bit line CBLN, and further connected to a selected sub-bit line SBL_iN (fourth bit line) on the negative cell side.

In the third mode, positive side determination select signal YRP is activated to "L" level, negative side determination select signal YRN is activated to "L" level, positive phase side bias connection signal CCSP is deactivated to "H" level, and negative phase side bias connection signal CCSN is deactivated to "H" level. As a result, positive side local bit line LBP is connected to positive side common bit line CBLP, and further connected to selected sub-bit line SBL_iP (third bit line) on the positive cell side. Negative side local bit line LBN is connected to negative side common bit line CBLN, and further connected to selected sub-bit line SBL_iN (fourth bit line) on the negative cell side.

Sense amplifier 79 includes an inverter IVP composed of a P channel MOS transistor P11 and an N channel MOS transistor N11, an inverter IVN composed of a P channel MOS transistor P12 and an N channel MOS transistor N12, and a P channel MOS transistor P20.

A node ND2 between P channel MOS transistor P11 and N channel MOS transistor N11 serving as the input of inverter IVP is connected to positive side local bit line LBP. A node ND3 between P channel MOS transistor P12 and N channel MOS transistor N12 serving as the input of inverter IVN is connected to negative side local bit line LBN. P channel MOS transistor P20 is provided between a node ND4 and the line of ground potential Vss, and has a gate for receiving a sense latch signal SLAT. The output of inverter IVP is connected to the input of inverter IVN, and the output of inverter IVN is connected to the input of inverter IVP.

When sense latch signal SLAT is set to "H", P channel MOS transistor P20 is turned on, and the difference between the voltage at node ND2 and the voltage at node ND3 is amplified by inverter IVP and inverter IVN.

Positive phase output driver 77 includes an inverter IV3, a NOR circuit LC3, P channel MOS transistors P7 and P8, and an N channel MOS transistor N8.

Inverter IV3 receives sense latch signal SLAT. NOR circuit LC3 has one input terminal for receiving the output of inverter IV3, and the other input terminal connected to positive side local bit line LBP. P channel MOS transistor P7, P channel MOS transistor P8, and N channel MOS transistor N8 are provided between a power supply of voltage VDD and ground potential Vss. P channel MOS transistor P8 and N channel MOS transistor N8 each have a gate connected to the output of NOR circuit LC3. P channel MOS transistor P7 has a gate connected to the output of inverter IV3.

When sense latch signal SLAT is at "H" level and positive side local bit line LBP is at "L" level, positive phase output driver 77 sets the level of positive phase global read bit line GBLr to "L" level. When sense latch signal SLAT is at "H" level and positive side local bit line LBP is at "L" level, positive phase output driver 77 sets the level of positive phase global read bit line GBLr to "L" level. When sense latch signal SLAT is at "H" level and positive side local bit line LBP is at "H" level, positive phase output driver 77 sets the level of positive phase global read bit line GBLr to "H" level. When sense latch signal SLAT is at "H" level, positive phase output driver 77 puts positive phase global read bit line GBLr in a high impedance state.

Negative phase output driver 78 includes an inverter IV4, a NOR circuit LC4, P channel MOS transistors P9 and P10, and an N channel MOS transistor N10.

Inverter IV4 receives sense latch signal SLAT. NOR circuit LC4 has one input terminal for receiving the output of inverter IV4, and the other input terminal connected to negative side local bit line LBN. P channel MOS transistor P9, P channel MOS transistor P10, and N channel MOS transistor N10 are provided between the power supply of voltage VDD and ground potential Vss. P channel MOS transistor P10 and N channel MOS transistor N10 each have a gate connected to the output of NOR circuit LC4. P channel MOS transistor P9 has a gate connected to the output of inverter IV4.

When sense latch signal SLAT is at "H" level and negative side local bit line LBN is at "L" level, negative phase output driver 78 sets the level of negative phase global read bit line /GBLr to "L" level. When sense latch signal SLAT is at "H" level and negative side local bit line LBN is at "L" level, negative phase output driver 78 sets the level of negative phase global read bit line /GBLr to "L" level. When sense latch signal SLAT is at "H" level and negative side local bit line LBN is at "H" level, negative phase output driver 78 sets the level of negative phase global read bit line /GBLr to "H" level. When sense latch signal SLAT is at "H" level, negative phase output driver 78 puts negative phase global read bit line /GBLr in a high impedance state.

(Data Output Unit)

Figure 9:
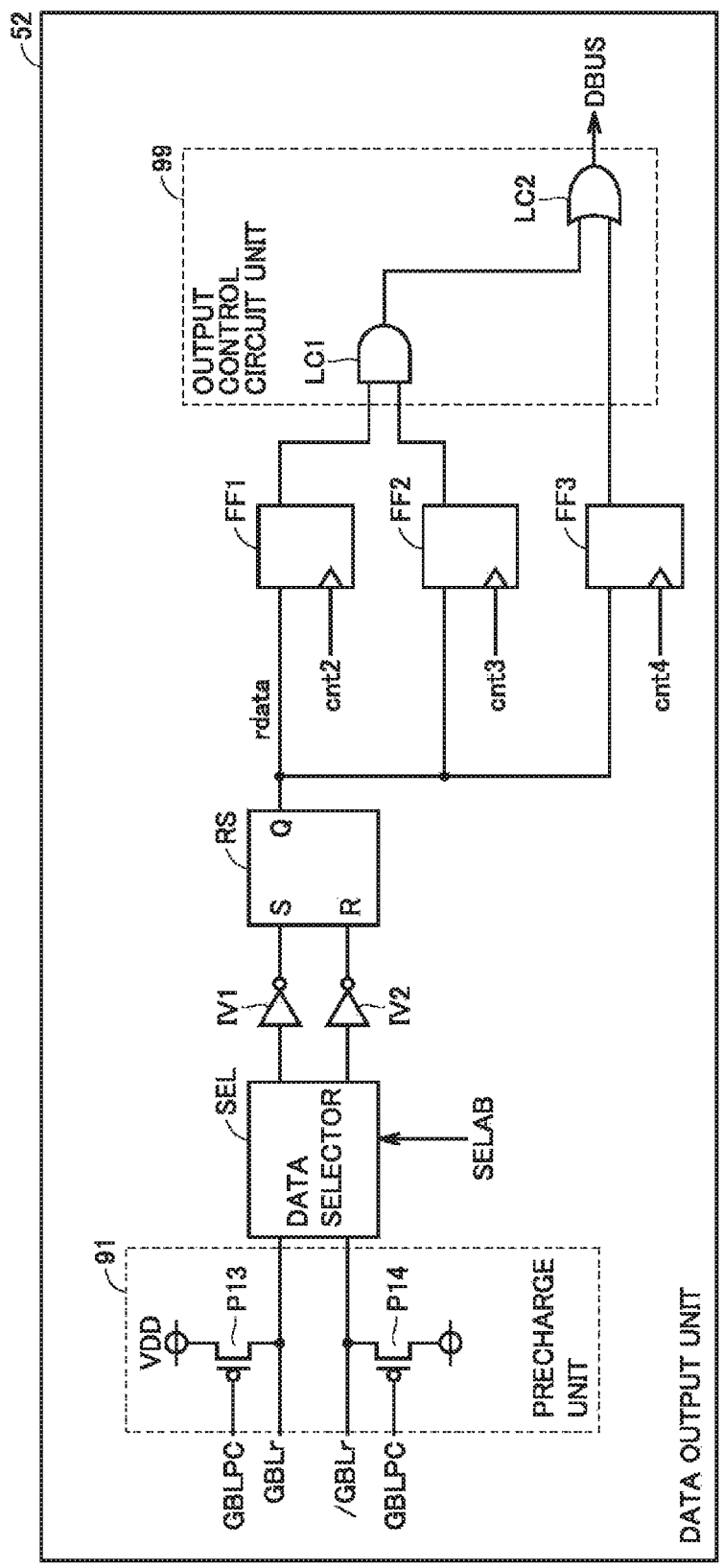
FIG. 9 is a diagram illustrating the configuration of a data output unit.

FIG. 9 is a diagram illustrating the configuration of data output unit 52.

Data output unit 52 includes a precharge unit 91, a data selector SEL, inverters IV1 and IV2, an RS flip-flop RS, flip-flops FF1, FF2 and FF3, and an output control circuit 99. Output control circuit 99 includes an AND circuit LC1 and an OR circuit LC2.

Precharge unit 91 includes a P channel MOS transistor P13 and a P channel MOS transistor P14.

P channel MOS transistor P13 is provided between the power supply of voltage VDD and positive phase global read bit line GBLr, and has a gate for receiving a global read bit line precharge signal GBLPC.

P channel MOS transistor P14 is provided between the power supply of voltage VDD and negative phase global read bit line /GBLr, and has a gate for receiving global read bit line precharge signal GBLPC.

Data selector SEL determines whether each of positive phase global read bit line GBLr and negative phase global read bit line /GBLr should be connected to inverter IV1 or inverter IV2 based on a select signal SELAB. Select signal SELAB is set to "H" level in the first mode and the third mode and is set to "L" level in the second mode by output circuit control unit 46.

When select signal SELAB is at "H" level, data selector SEL connects positive phase global read bit line GBLr to the input of inverter IV1, and connects negative phase global read bit line /GBLr to the input of inverter IV2.

When select signal SELAB is at "L" level, data selector SEL connects positive phase global read bit line GBLr to the input of inverter IV2, and connects negative phase global read bit line /GBLr to the input of inverter IV1.

RS flip-flop RS has a set terminal S for receiving the output of inverter IV1, a reset terminal R for receiving the output of inverter IV2, and an output terminal Q connected to input terminals of flip-flops FF1, FF2 and FF3. Read data rdata is output from output terminal Q.

When positive phase global read bit line GBLr is at "L" level and negative phase global read bit line /GBLr is at "H" level in the first mode and the third mode, and when positive phase global read bit line GBLr is at "H" level and negative phase global read bit line /GBLr is at "L" level in the second mode, the output of inverter IV1 is at "H" level and the output of inverter IV2 is at "L" level. When the output of inverter IV1 is at "H" level and the output of inverter IV2 is at "L" level, read data rdata output from output terminal Q is at "H" level.

When positive phase global read bit line GBLr is at "H" level and negative phase global read bit line /GBLr is at "L" level in the first mode and the third mode, and when positive phase global read bit line GBLr is at "L" level and negative phase global read bit line /GBLr is at "H" level in the second mode, the output of inverter IV1 is at "L" level and the output of inverter IV2 is at "H" level. When the output of inverter IV1 is at "L" level and the output of inverter IV2 is at "H" level, read data rdata output from output terminal Q is at "L" level.

Flip-flop FF1 latches read data rdata at the timing of a rise of a count signal cnt2. Count signal cnt2 rises to "H" level at timing t1 when the first mode ends and the second mode starts, so that read data rdata in the first mode is latched by flip-flop FF1. When positive phase global read bit line GBLr is at "L" level and negative phase global read bit line /GBLr is at "H" level (that is, when threshold voltage Vth of positive side memory cell MC1 is lower than erasure determination level VREF) in the first mode, flip-flop FF1 latches the "H" level. When positive phase global read bit line GBLr is at "H" level and negative phase global read bit line /GBLr is at "L" level (that is, when threshold voltage Vth of positive side memory cell MC1 is higher than or equal to erasure determination level VREF) in the first mode, flip-flop FF1 latches the "L" level.

Flip-flop FF2 latches read data rdata at the timing of a rise of a count signal cnt3. Count signal cnt3 rises to "H" level at timing t2 when the second mode ends and the third mode starts, so that read data rdata in the second mode is latched by flip-flop FF2. When positive phase global read bit line GBLr is at "H" level and negative phase global read bit line /GBLr is at "L" level (that is, when threshold voltage Vth of negative side memory cell MC2 is lower than erasure determination level VREF) in the second mode, flip-flop FF2 latches the "H" level. When positive phase global read bit line GBLr is at "L" level and negative phase global read bit line /GBLr is at "H" level (that is, when threshold voltage Vth of negative side memory cell MC2 is higher than or equal to erasure determination level VREF) in the second mode, flip-flop FF2 latches the "L" level.

Flip-flop FF3 latches read data rdata at the timing of a rise of a count signal cnt4. Count signal cnt4 rises to "H" level at timing t3 when the third mode ends, so that read data rdata in the third mode is latched by flip-flop FF3. When positive phase global read bit line GBLr is at "L" level and negative phase global read bit line /GBLr is at "H" level (that is, when threshold voltage Vth of positive side memory cell MC1 is lower than threshold voltage Vth of negative side memory cell MC2) in the third mode, flip-flop FF3 latches the "H" level. When positive phase global read bit line GBLr is at "H" level and negative phase global read bit line /GBLr is at "L" level (that is, when threshold voltage Vth of positive side memory cell MC1 is higher than or equal to threshold voltage Vth of negative side memory cell MC2) in the third mode, flip-flop FF3 latches the "L" level.

AND circuit LC1 outputs a logical product of the output of flip-flop FF1 and the output of flip-flop FF2. That is, when positive phase global read bit line GBLr is at "L" level and negative phase global read bit line /GBLr is at "H" level in the first mode, and when positive phase global read bit line GBLr is at "H" level and negative phase global read bit line /GBLr is at "L" level in the second mode, the output of AND circuit LC1 is at "H" level. That is, when threshold voltage Vth of negative side memory cell MC2 is lower than erasure determination level VREF and threshold voltage Vth of positive side memory cell MC1 is lower than erasure determination level VREF, the output of AND circuit LC1 is at "H" level. When at least one of conditions that threshold voltage Vth of negative side memory cell MC2 is higher than or equal to erasure determination level VREF and that threshold voltage Vth of positive side memory cell MC1 is higher than or equal to erasure determination level VREF is satisfied, the output of AND circuit LC1 is at "L" level.

OR circuit LC2 outputs a logical sum of the output of flip-flop FF3 and the output of AND circuit LC1 to data bus DBUS (data bus HBUS_D of high-speed bus HBUS). That is, when the output of AND circuit LC1 is at "H" level, "H" level is output to data bus DBUS regardless of the level of the output of flip-flop FF3. Namely, the output of flip-flop FF3 (that is, read data in the third mode) is masked. In other words, the output of flip-flop FF3 is not transmitted to data bus DBUS, and data bus DBUS takes an alternative prescribed value. It is noted that a logical circuit may be provided instead of OR circuit LC2 so that "L" level is output to data bus DBUS regardless of the level of the output of flip-flop FF3 when the output of AND circuit LC1 is at "H" level.

When the output of AND circuit LC1 is at "L" level, the output flip-flop FF3 (that is, read data in the third mode) is output to data bus DBUS.

(Output Circuit Control Unit)

Figure 10:
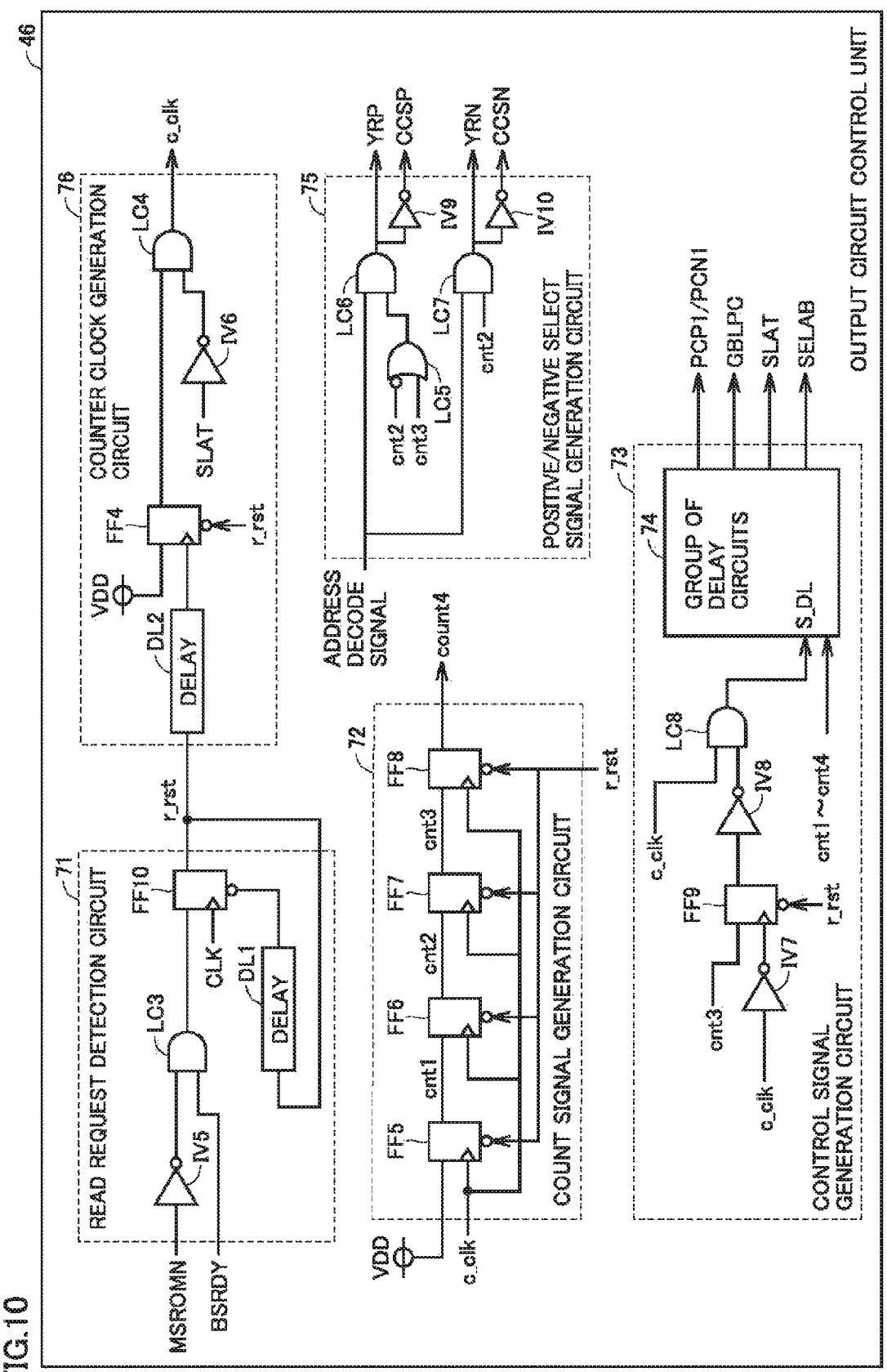
FIG. 10 is a diagram illustrating the configuration of an output circuit control unit.

FIG. 10 is a diagram illustrating the configuration of output circuit control unit 46.

Output circuit control unit 46 includes a read request detection circuit 71, a counter clock generation circuit 76, a count signal generation circuit 72, a positive/negative select signal generation circuit 75, and a control signal generation circuit 73.

Read request detection circuit 71 includes an inverter IV5, an AND circuit LC3, a flip-flop FF10, and a delay circuit DL1.

Inverter IV5 receives a module select signal MSROMN from output circuit control unit 46. AND circuit LC3 outputs a logical product of the output of inverter IV5 and a read request signal BSRDY from output circuit control unit 46. Flip-flop FF10 latches the output of AND circuit LC3 at the timing of a rise of a clock CLK sent from a clock pulse generator 11. An output signal of flip-flop FF10 is a read reset signal r_rst. Flip-flop FF1 is reset by the output of delay circuit DL1. Delay circuit DL1 delays read reset signal r_rst by a time d1 and inputs the delayed signal to a reset terminal of flip-flop FF10.

When module select signal MSROMN is at "L" level and read request signal BSRDY is at "H" level, a read request is detected by read request detection circuit 71, and read reset signal r_rst changes to "H" level at the timing of a rise of clock CLK. After a lapse of delay time d1 at delay circuit DL1, read reset signal r_rst returns to "L" level.

Counter clock generation circuit 76 includes a delay circuit DL2, a flip-flop FF4, an inverter IV6, and an AND circuit LC4.

Delay circuit DL2 delays read reset signal r_rst by a time d2. Flip-flop FF4 is reset by read reset signal r_rst. Flip-flop FF4 latches voltage VDD ("H" level) at the timing of a rise of the output of delay circuit DL2. Inverter IV6 receives sense latch signal SLAT. AND circuit LC4 outputs a logical product of the output of inverter IV6 and the output of flip-flop FF4 as a counter clock c_clk.

At the timing delayed by delay time d2 at delay circuit DL2 from the timing of the rise of read reset signal r_rst, counter clock c_clk rises by counter clock generation circuit 76. Then, counter clock c_clk falls at the timing of a rise of sense latch signal SLAT, and counter clock c_clk rises at the timing of a fall of sense latch signal SLAT.

Count signal generation circuit 72 includes flip-flops FF5, FF6, FF7 and FF8 in multiple stages.

Flip-flops FF5, FF6, FF7 and FF8 are reset by read reset signal r_rst. The outputs of flip-flops FF5, FF6, FF7 and FF8 are count signals cnt1, cnt2, cnt3 and cnt4, respectively. One of the first to third modes is selected by the levels of count signals cnt1 to cnt4.

Flip-flop FF5 latches voltage VDD ("H" level) at the timing of a rise of counter clock c_clk. Flip-flop FF6 latches count signal cnt1 ("H" level) at the timing of a rise of a counter clock ce_clk when count signal cnt1 is at "H" level. Flip-flop FF7 latches count signal cnt2 ("H" level) at the timing of a rise of counter clock c_clk when count signal cnt2 is at "H" level. Flip-flop FF8 latches count signal cnt3 ("H" level) at the timing of a rise of counter clock c_clk when count signal cnt3 is at "H" level.

Positive/negative select signal generation circuit 75 includes an OR circuit LC5, an AND circuit LC6, and an AND circuit LC7. OR circuit LC5 outputs a logical sum of an inverted signal of count signal cnt2 and count signal cnt3. AND circuit LC6 outputs a logical product of an address decode signal output from a column decoder 30 and the output of OR circuit LC5. AND circuit LC7 outputs a logical product of the address decode signal and count signal cnt2.

When the address decode signal is at "H" level and count signal cnt2 is at "L" level, positive side determination select signal YRP is at "H" level by OR circuit LC5 and AND circuit LC6. When the address decode signal is at "H" level and count signal cnt3 is at "H" level, positive side determination select signal YRP is at "H" level by OR circuit LC5 and AND circuit LC6. When the address decode signal is at "L" level, positive side determination select signal YRP is at "L" level by OR circuit LC5 and AND circuit LC6. When count signal cnt2 is at "H" level and count signal cnt3 is at "L" level, positive side determination select signal YRP is at "L" level by OR circuit LC5 and AND circuit LC6. As such, positive side determination select signal YRP is at "H" level when the addresses match in the first mode and the third mode.

When the address decode signal is at "H" level and count signal cnt2 is at "H" level, negative side determination select signal YRN is at "H" level by AND circuit LC7. When the address decode signal is at "L" level, negative side determination select signal YRN is at "L" level by AND circuit LC7. When count signal cnt2 is at "L" level, negative side determination select signal YRN is at "L" level by AND circuit LC7. As such, negative side determination select signal YRN is at "H" level when the addresses match in the second mode and the third mode.

Control signal generation circuit 73 includes an inverter IV7, a flip-flop FF9, an inverter IV8, an AND circuit LC8, and a group of delay circuits 74.

Inverter IV7 receives counter clock c_clk.

Flip-flop FF9 is reset by read reset signal r_rst. Flip-flop FF9 latches count signal cnt3 at the timing of a rise of the output of inverter IV7. Inverter IV8 receives the output of flip-flop FF9. AND circuit LC8 outputs a logical product of counter clock c_clk and the output of inverter IV8 as a delay start signal S_DL.

As a result, when count signal cnt3 is at "L" level, delay start signal S_DL rises and falls at the same timing of a rise and fall of counter clock c_clk. After the timing when count signal cnt3 changes to "H" level and counter clock c_clk falls, delay start signal S_DL is fixed to "L" level.

Group of delay circuits 74 generates sense latch signal SLAT and precharge signal GBLPC by delaying delay start signal S_DL by a time d3.

Group of delay circuits 74 generates precharge signals PCP1 and PCN1 by delaying delay start signal S_DL by a prescribed time.

At the timing when delay start signal S_DL has been delayed by the prescribed time, group of delay circuits 74 sets select signal SELAB to "H" level in the first mode and the third mode, and sets select signal SELAB to "L" level in the second mode.

After the timing when count signal cnt3 changes to "H" level and counter clock c_clk falls, delay start signal S_DL is fixed to "L" level. After the third mode ends, therefore, sense latch signal SLAT and precharge signals PCP1, PCN1, GBLPC, and select signal SELAB are not activated to "H" level.

(Operation)

Figure 11:
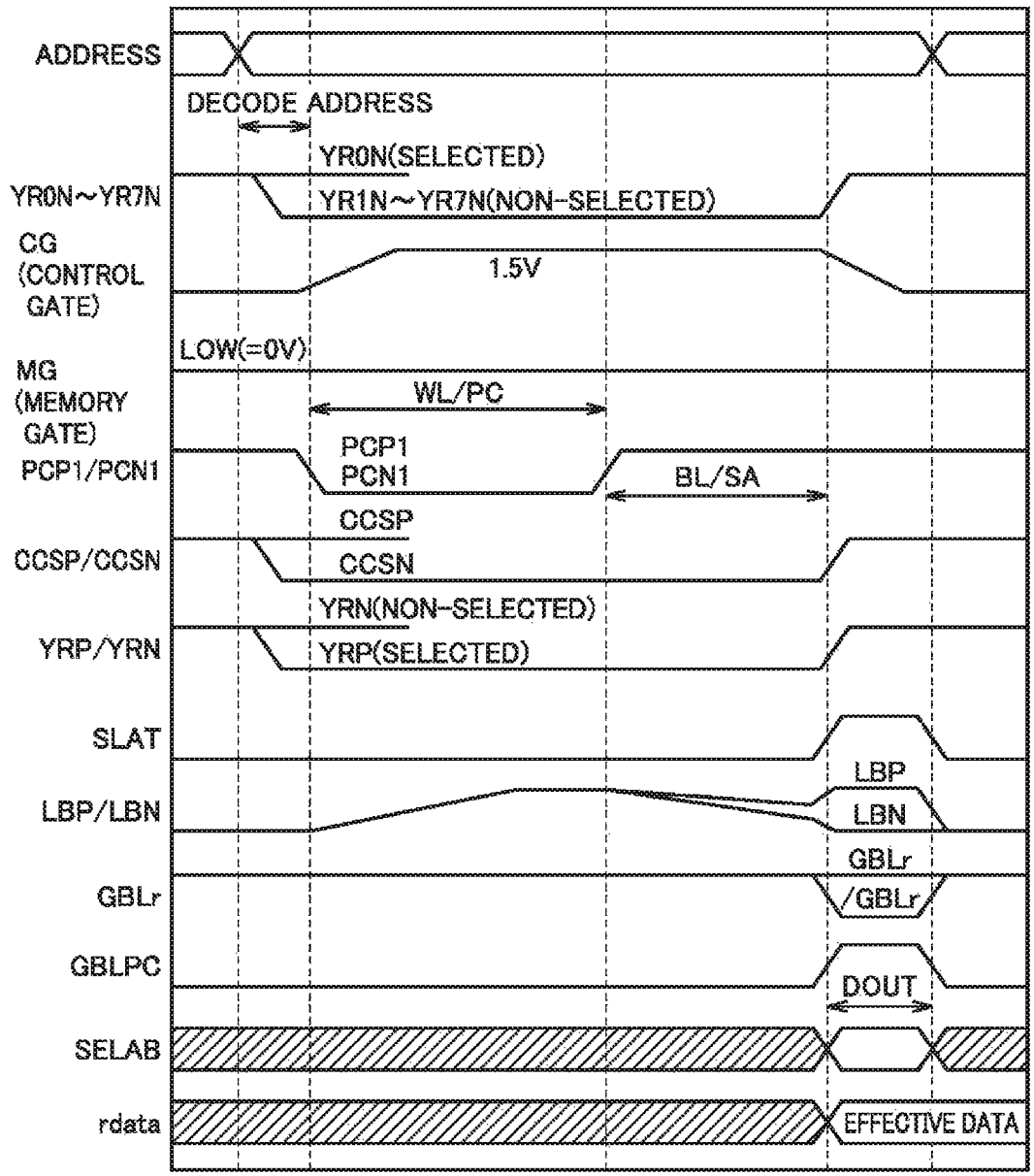
FIG. 11 is a diagram illustrating operation in a first mode.

FIG. 11 is a diagram illustrating the operation in the first mode.

When column decoder 30 decodes the address, read select signal YR0N is activated to "H" level and read select signals YR1N to YR7N are deactivated to "L" level. Based on the address decode signal from column decoder 30 and count signals cnt2 and cnt3, positive/negative select signal generation circuit 75 in output circuit control unit 46 sets positive side determination select signal YRP to "L" level, sets positive phase side bias connection signal CCSP to "H" level, sets negative side determination select signal YRN to "H" level, and sets negative phase side bias connection signal CCSN to "L" level. Thereby, positive side local bit line LBP is connected to sub-bit line SBL_0P through positive side common bit line CBLP, while negative side local bit line LBN is connected to constant current source 81.

Then, control signal generation circuit 73 in output circuit control unit 46 sets precharge signals PCP1 and PCN1 to "L" level. Thereby, positive side local bit line LBP and negative side local bit line LBN are precharged to "H" level. In addition, global read bit line precharge signal GBLPC is set to "L" level by control signal generation circuit 73, and thus global read bit lines GBLr and /GBLr are precharged to "H" level.

A power supply circuit 31 maintains the voltage of source line SL and the voltage of memory gate MG at "0" V, and sets the voltage of control gate CG to "1.5" V.

Then, control signal generation circuit 73 sets precharge signals PCP1 and PCN1 to "H" level. Thereby, the precharge of positive side local bit line LBP and negative side local bit line LBN ends.

Differential amplification unit 50 amplifies the difference between the voltage of positive side local bit line LBP connected to sub-bit line SBL_0P and the voltage of negative side local bit line LBN connected to constant current source 81.

Then, control signal generation circuit 73 sets sense latch signal SLAT to "H" level, and sets global read bit line precharge signal GBLPC to "H" level. Thereby, when positive side local bit line LBP is at "L" level and negative side local bit line LBN is at "H" level, the level of positive phase global read bit line GBLr is set to "L" level, and the level of negative phase global read bit line /GBLr is set to "H" level. When positive side local bit line LBP is at "H" level and negative side local bit line LBN is at "L" level, the level of positive phase global read bit line GBLr is set to "H" level, and the level of negative phase global read bit line /GBLr is set to "L" level.

In addition, control signal generation circuit 73 sets select signal SELAB to "H" level. Thereby, when positive phase global read bit line GBLr is at "L" level and negative phase global read bit line /GBLr is at "H" level, read data rdata is at "H" level, and the "H" level is latched by flip-flop FF1. That is, when threshold voltage Vth of positive side memory cell MC1 is lower than erasure determination level VREF, the "H" level is latched by flip-flop FF1.

On the other hand, when positive phase global read bit line GBLr is at "H" level and negative phase global read bit line /GBLr is at "L" level, read data rdata is at "L" level, and the "L" level is latched by flip-flop FF1. That is, when threshold voltage Vth of positive side memory cell MC1 is higher than or equal to erasure determination level VREF, the "L" level is latched by flip-flop FF1.

Figure 12:
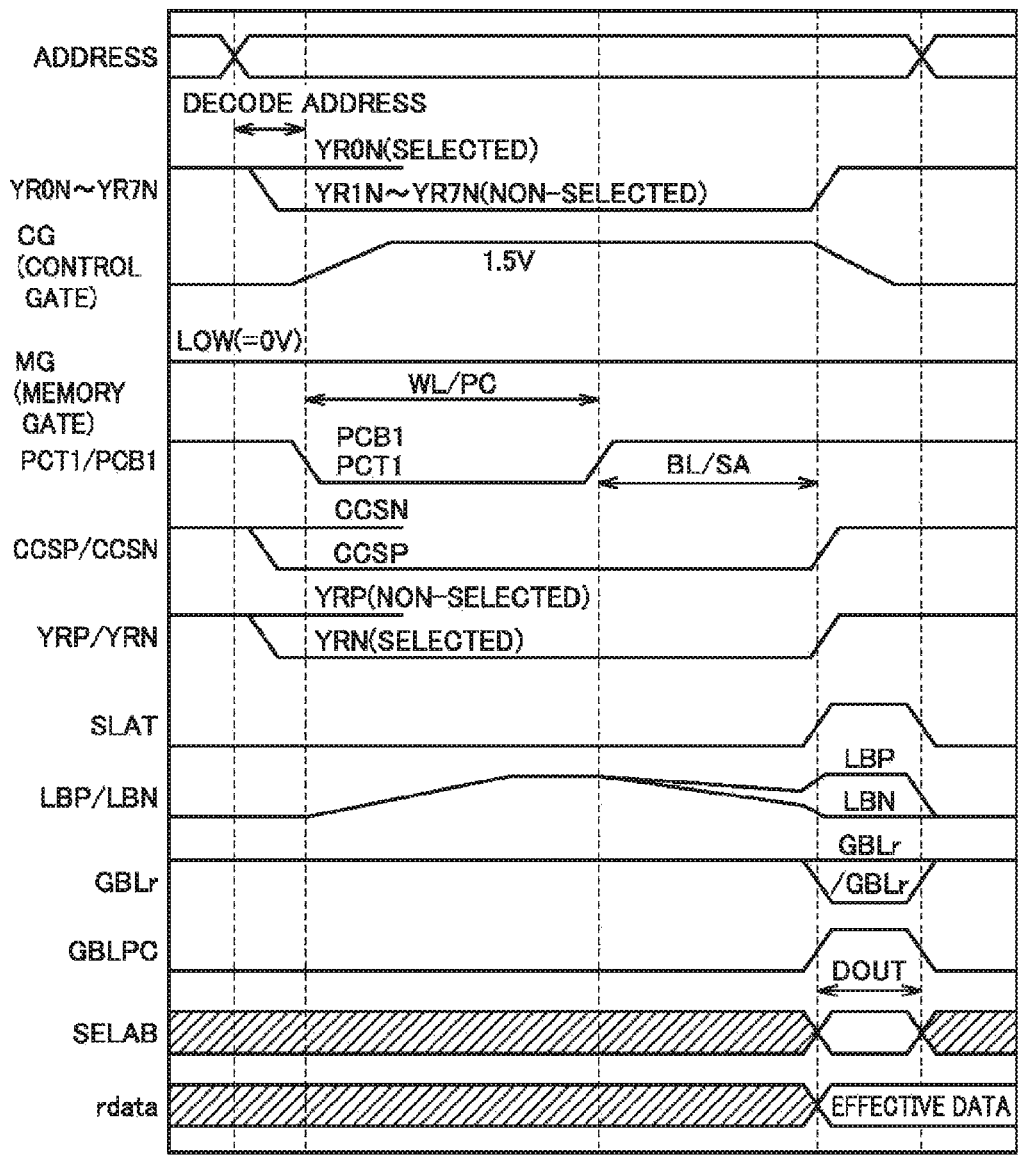
FIG. 12 is a diagram illustrating operation in a second mode.

FIG. 12 is a diagram illustrating the operation in the second mode.

When column decoder 30 decodes the address, read select signal YR0N is activated to "H" level and read select signals YR1N to YR7N are deactivated to "L" level. Based on the address decode signal from column decoder 30 and count signals cnt2 and cnt3, positive/negative select signal generation circuit 75 in output circuit control unit 46 sets positive side determination select signal YRP to "H" level, sets positive phase side bias connection signal CCSP to "L" level, sets negative side determination select signal YRN to "L" level, and sets negative phase side bias connection signal CCSN to "H" level. Thereby, negative side local bit line LBN is connected to sub-bit line SBL_0N through negative side common bit line CBLN, while positive side local bit line LBP is connected to constant current source 81.

Then, control signal generation circuit 73 in output circuit control unit 46 sets precharge signals PCP1 and PCN1 to "L" level. Thereby, positive side local bit line LBP and negative side local bit line LBN are precharged to "H" level. In addition, global read bit line precharge signal GBLPC is set to "L" level by control signal generation circuit 73, and thus global read bit lines GBLr and /GBLr are precharged to "H" level.

Power supply circuit 31 maintains the voltage of source line SL and the voltage of memory gate MG at "0" V, and sets the voltage of control gate CG to "1.5" V.

Then, control signal generation circuit 73 sets precharge signals PCP1 and PCN1 to "H" level. Thereby, the precharge of positive side local bit line LBP and negative side local bit line LBN ends.

Differential amplification unit 50 amplifies the difference between the voltage of negative side local bit line LBN connected to sub-bit line SBL_0N and the voltage of positive side local bit line LBP connected to constant current source 81.

Then, control signal generation circuit 73 sets sense latch signal SLAT to "H" level, and sets global read bit line precharge signal GBLPC to "H" level. Thereby, when positive side local bit line LBP is at "L" level and negative side local bit line LBN is at "H" level, the level of positive phase global read bit line GBLr is set to "L" level, and the level of negative phase global read bit line /GBLr is set to "H" level. When positive side local bit line LBP is at "H" level and negative side local bit line LBN is at "L" level, the level of positive phase global read bit line GBLr is set to "H" level, and the level of negative phase global read bit line /GBLr is set to "L" level.

In addition, control signal generation circuit 73 sets select signal SELAB to "L" level. Thereby, when positive phase global read bit line GBLr is at "H" level and negative phase global read bit line /GBLr is at "L" level, read data rdata is at "H" level, and the "H" level is latched by flip-flop FF2. That is, when threshold voltage Vth of negative side memory cell MC2 is lower than erasure determination level VREF, the "H" level is latched by flip-flop FF2.

On the other hand, when positive phase global read bit line GBLr is at "L" level and negative phase global read bit line /GBLr is at "H" level, read data rdata is at "L" level, and the "L" level is latched by flip-flop FF2. That is, when threshold voltage Vth of negative side memory cell MC2 is higher than or equal to erasure determination level VREF, the "L" level is latched by flip-flop FF2.

Figure 13:
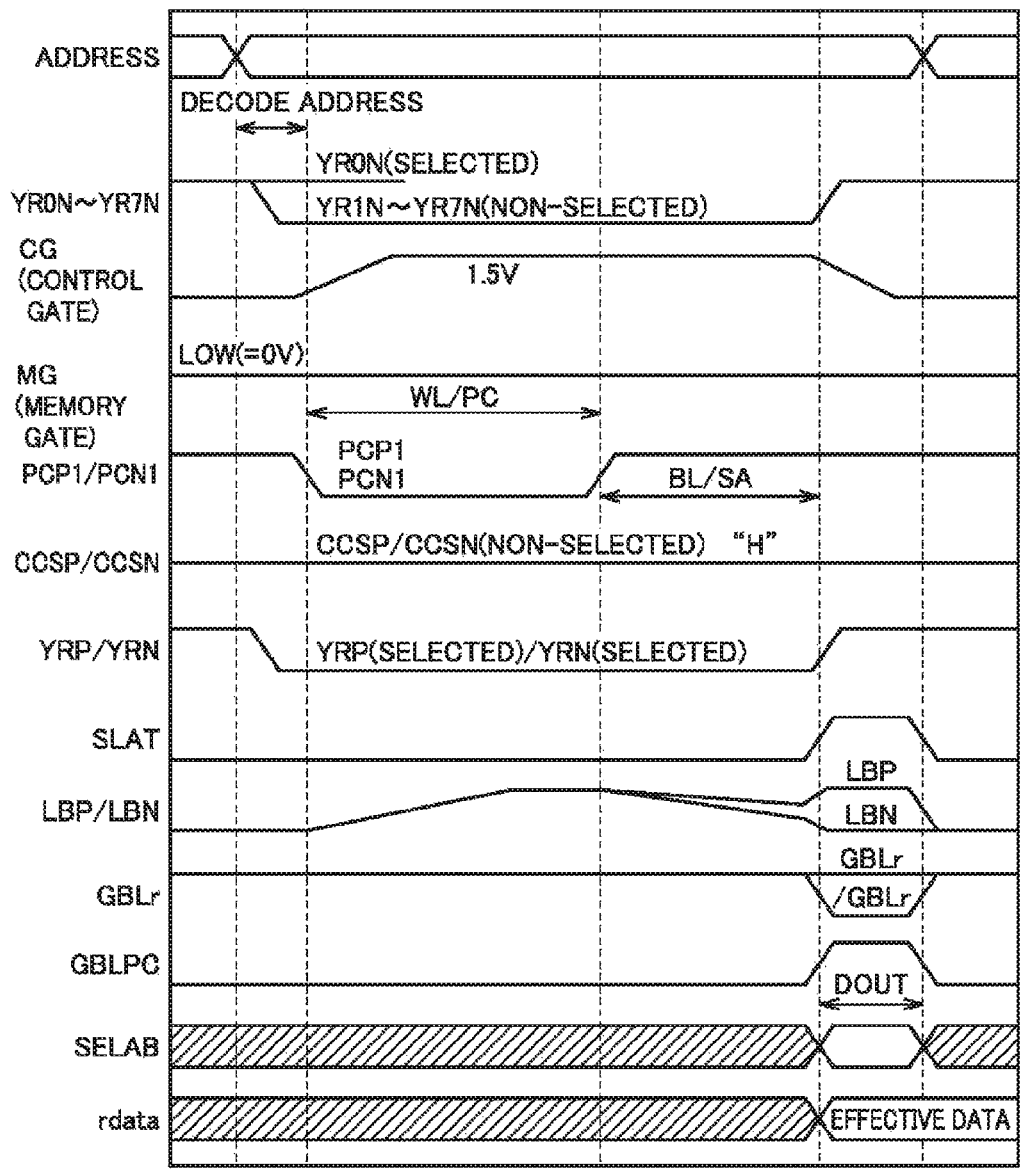
FIG. 13 is a diagram illustrating operation in a third mode.

FIG. 13 is a diagram illustrating the operation in the third mode.

When column decoder 30 decodes the address, read select signal YR0N is activated to "H" level and read select signals YR1N to YR7N are deactivated to "L" level. Based on the address decode signal from column decoder 30 and count signals cnt2 and cnt3, positive/negative select signal generation circuit 75 in output circuit control unit 46 sets positive side determination select signal YRP to "L" level, sets positive phase side bias connection signal CCSP to "H" level, sets negative side determination select signal YRN to "L" level, and sets negative phase side bias connection signal CCSN to "H" level. Thereby, positive side local bit line LBP is connected to sub-bit line SBL_0P through positive side common bit line CBLP, while negative side local bit line LBN is connected to sub-bit line SBL_0N through negative side common bit line CBLN.

Then, control signal generation circuit 73 in output circuit control unit 46 sets precharge signals PCP1 and PCN1 to "L" level. Thereby, positive side local bit line LBP and negative side local bit line LBN are precharged to "H" level. In addition, global read bit line precharge signal GBLPC is set to "L" level by control signal generation circuit 73, and thus global read bit lines GBLr and /GBLr are precharged to "H" level.

Power supply circuit 31 maintains the voltage of source line SL and the voltage of memory gate MG at "0" V, and sets the voltage of control gate CG to "1.5" V.

Then, control signal generation circuit 73 sets precharge signals PCP1 and PCN1 to "H" level. Thereby, the precharge of positive side local bit line LBP and negative side local bit line LBN ends.

Differential amplification unit 50 amplifies the difference between the voltage of positive side local bit line LBP connected to sub-bit line SBL_0P and the voltage of negative side local bit line LBN connected to sub-bit line SBL_0N.

Then, control signal generation circuit 73 sets sense latch signal SLAT to "H" level, and sets global read bit line precharge signal GBLPC to "H" level. Thereby, when positive side local bit line LBP is at "L" level and negative side local bit line LBN is at "H" level, the level of positive phase global read bit line GBLr is set to "L" level, and the level of negative phase global read bit line /GBLr is set to "H" level. When positive side local bit line LBP is at "H" level and negative side local bit line LBN is at "L" level, the level of positive phase global read bit line GBLr is set to "H" level, and the level of negative phase global read bit line /GBLr is set to "L" level.

In addition, control signal generation circuit 73 sets select signal SELAB to "H" level. Thereby, when positive phase global read bit line GBLr is at "L" level and negative phase global read bit line /GBLr is at "H" level, read data rdata is at "H" level, and the "H" level is latched by flip-flop FF3. That is, when threshold voltage Vth of positive side memory cell MC1 is lower than threshold voltage Vth of negative side memory cell MC2, the "H" level is latched by flip-flop FF3.

On the other hand, when positive phase global read bit line GBLr is at "H" level and negative phase global read bit line /GBLr is at "L" level, read data rdata is at "L" level, and the "L" level is latched by flip-flop FF3. That is, when threshold voltage Vth of positive side memory cell MC1 is higher than or equal to threshold voltage Vth of negative side memory cell MC2, the "L" level is latched by flip-flop FF3.

Figure 14:
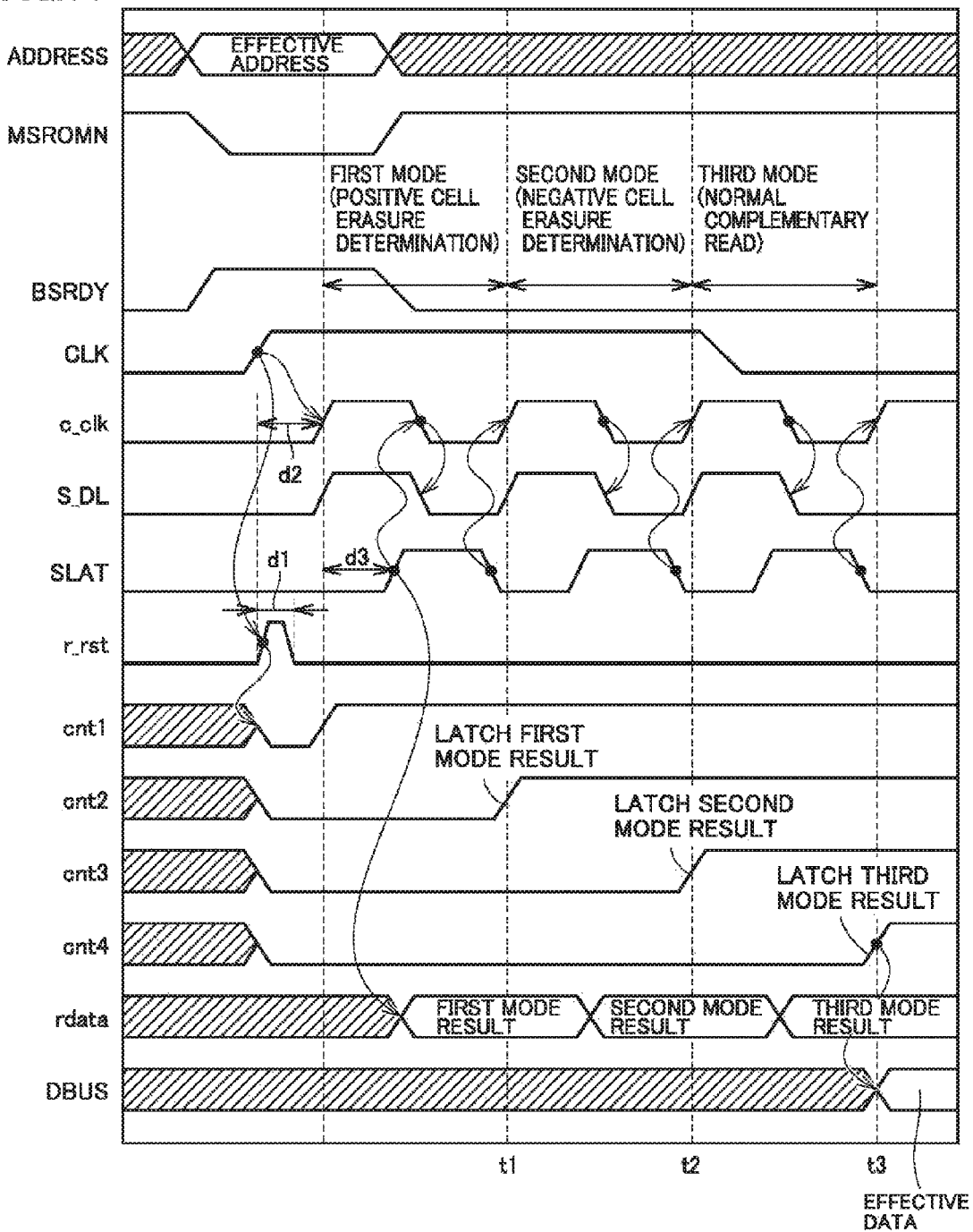
FIG. 14 is a diagram illustrating timings at which various control signals are generated.

FIG. 14 is a diagram illustrating timings at which the various control signals are generated.

First, when module select signal MSROMN is at "L" level and read request signal BSRDY is at "H" level, a read request is detected by read request detection circuit 71, and read reset signal r_rst rises to "H" level at the timing of a rise of clock CLK. Then, after a lapse of delay time d1 at delay circuit DL1, read reset signal r_rst returns to "L" level.

At the timing when read reset signal r_rst changes to "H" level, count signals cnt1, cnt2, cnt3 and cnt4 are set to "L" level by count signal generation circuit 72.

At the timing delayed by delay time d2 at delay circuit DL2 from the timing of the rise of read reset signal r_rst, counter clock c_clk rises for the first time by counter clock generation circuit 76.

At the timing of the first rise of counter clock c_clk, count signal cnt1 is set to "H" level by count signal generation circuit 72. At the timing of the rise of count signal cnt1, the first mode starts.

In addition, at the timing of the first rise of counter clock c_clk, delay start signal S_DL rises for the first time by control signal generation circuit 73. At the timing delayed by delay time d3 from the timing of the first rise of delay start signal S_DL, sense latch signal SLAT rises for the first time by control signal generation circuit 73. Although not shown, global read bit line precharge signal GBLPC is set to "H" level and select signal SELAB is set to "H" level by control signal generation circuit 73. Thereby, the result of comparison in the first mode serves as read data rdata in data output unit 52.

At the timing of the first rise of sense latch signal SLAT, counter clock c_clk falls for the first time by counter clock generation circuit 76. At the timing of the first fall of counter clock c_clk, delay start signal S_DL falls for the first time by control signal generation circuit 73.

At the timing delayed by delay time d3 from the timing of the first fall of delay start signal S_DL, sense latch signal SLAT falls for the first time by control signal generation circuit 73.

At the timing of the first fall of sense latch signal SLAT, counter clock c_clk rises again (second time) by counter clock generation circuit 76. At the timing of the second rise of counter clock c_clk, delay start signal S_DL rises again (second time) by control signal generation circuit 73.

At the timing of the second rise of counter clock c_clk (t1), count signal cnt2 is set to "H" level by count signal generation circuit 72. At the timing of the rise of count signal cnt2, read data rdata representing the result of comparison in the first mode is latched by flip-flop FF1 in data output unit 52, and the first mode ends. In addition, at the timing of the rise of count signal cnt2, the second mode starts.

In addition, at the timing delayed by delay time d3 from the timing of the second rise of delay start signal S_DL, sense latch signal SLAT rises again (second time) by control signal generation circuit 73. Although not shown, global read bit line precharge signal GBLPC is set to "H" level and select signal SELAB is set to "L" level by control signal generation circuit 73. Thereby, the result of comparison in the second mode serves as read data rdata in data output unit 52.

At the timing of the second rise of sense latch signal SLAT, counter clock c_clk falls again (second time) by counter clock generation circuit 76. At the timing of the second fall of counter clock c_clk, delay start signal S_DL falls again (second time) by control signal generation circuit 73.

At the timing delayed by delay time d3 from the timing of the second fall of delay start signal S_DL, sense latch signal SLAT falls again (second time) by control signal generation circuit 73.

At the timing of the second fall of sense latch signal SLAT, counter clock c_clk rises again (third time) by counter clock generation circuit 76. At the timing of the third rise of counter clock c_clk, delay start signal S_DL rises again (third time) by control signal generation circuit 73.

At the timing of the third rise of counter clock c_clk (t2), count signal cnt3 is set to "H" level by count signal generation circuit 72. At the timing of the rise of count signal cnt3, read data rdata representing the result of comparison in the second mode is latched by flip-flop FF2 in data output unit 52, and the second mode ends. In addition, at the timing of the rise of count signal cnt3, the third mode starts.

In addition, at the timing delayed by delay time d3 from the timing of the third rise of delay start signal S_DL, sense latch signal SLAT rises again (third time) by control signal generation circuit 73. Although not shown, global read bit line precharge signal GBLPC is set to "H" level and select signal SELAB is set to "H" level by control signal generation circuit 73. Thereby, the result of comparison in the third mode serves as read data rdata in data output unit 52.

At the timing of the third rise of sense latch signal SLAT, counter clock c_clk falls again (third time) by counter clock generation circuit 76. At the timing of the third fall of counter clock c_clk, delay start signal S_DL falls again (third time) by control signal generation circuit 73.

At the timing delayed by delay time d3 from the timing of the third fall of delay start signal S_DL, sense latch signal SLAT falls again (third time) by control signal generation circuit 73.

At the timing of the third fall of sense latch signal SLAT, counter clock c_clk rises again (fourth time) by counter clock generation circuit 76. However, at the timing of the fourth rise of counter clock c_clk, delay start signal S_DL does not rise again (fourth time) by control signal generation circuit 73.

At the timing of the fourth rise of counter clock c_clk (t3), count signal cnt4 is set to "H" level by count signal generation circuit 72. At the timing of the rise of count signal cnt4, read data rdata representing the result of comparison in the third mode is latched by flip-flop FF3 in data output unit 52, and the third mode ends.

Data based on the result of comparison in the first mode latched by flip-flop FF1, the result of comparison in the second mode latched by flip-flop FF2, and the result of comparison in the third mode latched by flip-flop FF3 is output to data bus DBUS by AND circuit LC1 and OR circuit LC2 in data output unit 52.

When the result of comparison in the first mode shows that threshold voltage Vth of positive side memory cell MC1 is lower than erasure determination level VREF and the result of comparison in the second mode shows that threshold voltage Vth of negative side memory cell MC2 is lower than erasure determination level VREF, a fixed value "H" level is output to data bus DBUS.

When the result of comparison in the first mode shows that threshold voltage Vth of positive side memory cell MC1 is higher than or equal to erasure determination level VREF or the result of comparison in the second mode shows that threshold voltage Vth of negative side memory cell MC2 is higher than or equal to erasure determination level VREF, data representing the result of comparison in the third mode is output to data bus DBUS.

As described above, according to this embodiment, when the threshold voltages of the positive and negative cells forming the twin cell are lower than the erasure determination level, the data stored in the twin cell is masked as the fixed value, thereby preventing reading of data written before the erasure.

[Third Embodiment]

Although the data obtained by masking the stored data read from the twin cell is output when threshold voltages Vth of both memory cells forming the twin cell are lower than erasure determination level VREF in the first and second embodiments, this is not limiting. In this embodiment, when threshold voltages Vth of both memory cells are lower than erasure determination level VREF, a fixed value is output as read data, instead of reading the data stored in the twin cell (that is, instead of performing the process in the third mode).

The configuration of the semiconductor device of the third embodiment is substantially the same as the configuration of the semiconductor device of the first embodiment in FIG. 1, but is different in function of output circuit 105.

Upon receiving a request to read twin cell 104, when threshold voltage Vth of first storage element 102 is lower than the erasure determination level and threshold voltage Vth of second storage element 103 is lower than the erasure determination level, output circuit 105 outputs a fixed value as read data, instead of reading the data stored in twin cell 104. Instead of the fixed value, a random value may be output, or nothing may be output.

Figure 15:
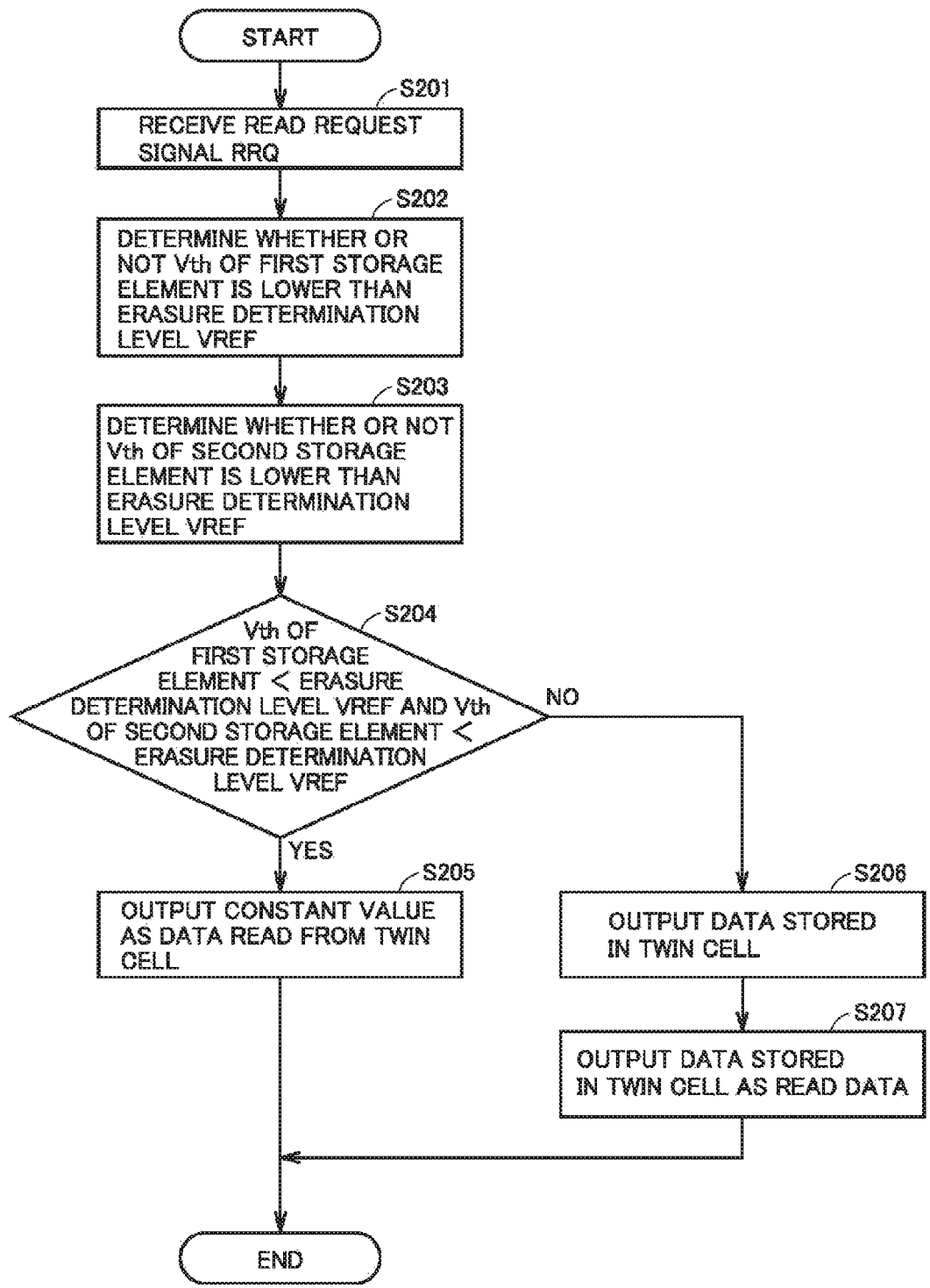
FIG. 15 is a flowchart illustrating a procedure of reading twin cell data from a memory array in a semiconductor device of a third embodiment.

FIG. 15 is a flowchart illustrating a procedure of reading the data from memory array 101 in the semiconductor device of the third embodiment.

First, output circuit 105 receives read request signal RRQ (step S201).

Then, output circuit 105 determines whether or not threshold voltage Vth of first storage element 102 is lower than erasure determination level VREF by reading data stored in first storage element 102 through bit line BL (step S202).

Then, output circuit 105 determines whether or not threshold voltage Vth of second storage element 103 is lower than erasure determination level VREF by reading data stored in second storage element 103 through bit line /BL (step S203).

When threshold voltage Vth of first storage element 102 is lower than erasure determination level VREF and threshold voltage Vth of second storage element 103 is lower than erasure determination level VREF (YES in step S204), output circuit 105 outputs a fixed value ("0" or "1") (step S205).

When threshold voltage Vth of first storage element 102 is higher than or equal to erasure determination level VREF or threshold voltage Vth of second storage element 103 is higher than or equal to erasure determination level VREF (NO in step S204), output circuit 105 reads the data stored in twin cell 104 through the pair of bit lines BL and /BL (step S206). Further, output circuit 105 outputs the data stored in twin cell 104 as read data (step S207).

The present invention is not limited to the embodiments described above, and also includes variations as described below, for example.

(1) Switching Control

During the read process described in the embodiments of the present invention, upon receiving a read request, it is determined whether or not threshold voltages Vth of both memory cells of the twin cell are lower than erasure determination level VREF (first and second modes), and the data stored in the twin cell is determined, to switch between the direct output of the determined data stored in the twin cell and the output of the masked data based on the results in the first and second modes (third mode).

(2) Connection in Second Mode

Although negative side local bit line LBN and negative side common bit line CBLN are connected, positive side local bit line LBP and constant current source 81 are connected, positive phase global read bit line GBLr and inverter IV2 are connected, and negative phase global read bit line /GBLr and inverter IV1 are connected in the second mode in the embodiments of the present invention, this is not limiting.

In the second mode, positive side local bit line LBP and negative side common bit line CBLN may be connected, negative side local bit line LBN and constant current source 81 may be connected, positive phase global read bit line GBLr and inverter IV1 may be connected, and negative phase global read bit line /GBLr and inverter IV2 may be connected.

The present invention is not limited to the semiconductor device configured to perform the read process described above. For example, the semiconductor device may have both a function of normally reading the twin cell (only the determination of the data stored in the twin cell in the third mode) and the reading function in the embodiments of the present invention described above, where switching can be made between the functions.

Although the invention made by the present inventor has been specifically described based on the embodiments, it goes without saying that the present invention is not limited to the embodiments but can be modified in various ways within the scope not departing from the spirit of the invention.

REFERENCE SIGNS LIST 1 microcomputer (MCU); 2 central processing unit (CPU); 3 direct memory access controller (DMAC); 4 bus interface circuit (BIF); 5 random access memory (RAM); 6 flash memory module (FMDL); 7 flash sequencer (FSQC); 8, 9 external input/output port (PRT); 10 timer (TMR); 11 clock pulse generator (CPG); 19, 101 memory array (MARY); 20 sub-bit line selector; 22 read column selector; 24 first row decoder (RDEC1); 25 second row decoder (RDEC2); 27 write data latch circuit; 28 rewrite column selector; 29 input/output circuit (IOBUF); 30 column decoder (CDEC); 31 power supply circuit (VPG); 32 timing generator (TMG); 40 read system discharge circuit; 41 write system discharge circuit; 46 output circuit control unit; 48, 105 output circuit; 50 differential amplification unit; 52 data output unit; 71 read request detection circuit; 72 count signal generation circuit; 73 control signal generation circuit; 74 group of delay circuits; 75 positive/negative select signal generation circuit; 76 counter clock generation circuit; 77 positive phase side output driver; 78 negative phase side output driver; 79 sense amplifier; 81 constant current source; 82, 84 switch; 83, 91 precharge unit; 99 output control circuit; 100 semiconductor device; 102 first storage element; 103 second storage element; 104 twin cell; IV1 to IV10 inverter; DL1, DL2 delay circuit; FF1 to FF10 flip-flop; LC1, LC3, LC4, LC6, LC7, LC8 AND circuit; LC2, LC5 OR circuit; SEL data selector; RS RS flip-flop; P1 to P14, P20 P channel MOS transistor; N3, N8, N10, N11, N12 N channel MOS transistor; VSA_P, VSA_N verify sense amplifier; PVSL, NVSL verify signal line; PSL, NSL signal line; HACSP high-speed access port; LACSP low-speed access port; LTP, LTN static latch; MC1, MC2 nonvolatile memory cell; WMBL write main bit line; WMBL_0P to WMBL_3P main bit line on positive cell side; WMBL_0N to WMBL_3N main bit line on negative cell side; SBL sub-bit line; SBL_0P to SBL_0P sub-bit line on positive cell side; SBL_0N to SBL_7N sub-bit line on negative cell side; CBLP positive side common bit line; CBLN negative side common bit line; LBP positive side local bit line; LBN negative side local bit line; GBLr positive phase global read bit line; /GBLr negative phase global read bit line; WL word line; MGL memory gate select line; HBUS high-speed bus; HBUS_D high-speed data bus; PBUS peripheral bus; PBUS_D peripheral data bus.

The invention claimed is:

1. A semiconductor device comprising:
a memory array including a plurality of twin cells, each of the twin cells composed of a first storage element and a second storage element configured to hold binary data according to a difference in threshold voltage between them, the first storage element and the second storage element each being electrically rewritable; and
an output circuit configured to, upon receiving a request to read the twin cell, when the threshold voltage of the first storage element forming the twin cell is lower than an erasure determination level and the threshold voltage of the second storage element forming the twin cell is lower than the erasure determination level, mask the data stored in the twin cell and output the masked data.

2. The semiconductor device according to claim 1, wherein
upon receiving the request to read the twin cell, when the threshold voltage of the first storage element forming the twin cell is lower than the erasure determination level and the threshold voltage of the second storage element forming the twin cell is lower than the erasure determination level, the output circuit outputs a fixed value.

3. The semiconductor device according to claim 1, wherein
the output circuit includes a differential amplification unit configured to, in response to the request to read the twin cell, amplify a difference between a voltage generated in a first bit line in accordance with the threshold voltage of the first storage element and a voltage generated in a second bit line upon connected to a constant current source in a first mode, amplify a difference between a voltage generated in the second bit line in accordance with the threshold voltage of the second storage element and a voltage generated in the first bit line upon connected to the constant current source in a second mode, and amplify a difference between a voltage generated in the first bit line in accordance with the threshold voltage of the first storage element and a voltage generated in the second bit line in accordance with the threshold voltage of the second storage element in a third mode.

4. The semiconductor device according to claim 3, comprising:
a third bit line connected to the first storage element; and
a fourth bit line connected to the second storage element, wherein
the differential amplification unit includes
an amplifier configured to amplify a potential difference between the first bit line and the second bit line,
a first switch configured to connect the first bit line and the third bit line in the first mode, connect the second bit line and the fourth bit line in the second mode, and connect the first bit line and the third bit line and connect the second bit line and the fourth bit line in the third mode, and
a second switch configured to connect the constant current source and the second bit line in the first mode, and connect the constant current source and the first bit line in the second mode.

5. The semiconductor device according to claim 4, wherein
the differential amplification unit includes
a first output driver configured to output a voltage of the first bit line after the amplification by the amplifier, and
a second output driver configured to output a voltage of the second bit line after the amplification by the amplifier.

6. The semiconductor device according to claim 5, wherein
the output circuit includes a data output unit configured to receive an output of the differential amplification unit, and
the data output unit includes
a first storage unit configured to store the output of the differential amplification unit in the first mode,
a second storage unit configured to store the output of the differential amplification unit in the second mode,
a third storage unit configured to store the output of the differential amplification unit in the third mode, and
an output control circuit configured to output data obtained by masking the data stored in the third storage unit, when the first storage unit stores data showing that the threshold voltage of the first storage element is lower than the erasure determination level, and the second storage unit stores data showing that the threshold voltage of the second storage element is lower than the erasure determination level.

7. The semiconductor device according to claim 6, wherein
the output circuit includes a selector configured to select the output of the first output driver as a first input value and the output of the second output driver as a second input value in the first mode and the third mode, and select the output of the second output driver as the first input value and the output of the first output driver as the second input value in the second mode, and
the first storage unit, the second storage unit and the third storage unit store values based on the first input value and the second input value.

8. The semiconductor device according to claim 4, comprising:
a clock pulse generator configured to generate a clock for controlling the semiconductor device; and
an output circuit control unit configured to generate a signal for controlling the output circuit, wherein
the output circuit control unit includes
a detection circuit configured to detect the request to read the twin cell,
a counter clock generation circuit configured to generate, when the request to read the twin cell is detected, a counter clock having a cycle shorter than that of the clock generated by the clock pulse generator, a count signal generation circuit configured to generate a plurality of count signals which change to a first level based on each rise of the counter clock, and a select signal generation circuit configured to generate signals for controlling the first switch and the second switch based on the generated plurality of count signals.

9. The semiconductor device according to claim 6, comprising:

a clock pulse generator configured to generate a clock for controlling the semiconductor device; and an output circuit control unit configured to generate a signal for controlling the output circuit, wherein the output circuit control unit includes a detection circuit configured to detect the request to read the twin cell, a counter clock generation circuit configured to generate, when the request to read the twin cell is detected, a counter clock having a cycle shorter than that of the clock generated by the clock pulse generator, and a count signal generation circuit configured to generate three count signals which change to a first level based on each rise of the counter clock, and each of the first storage unit, the second storage unit and the third storage unit latches the output of the differential amplification unit based on one of the generated three count signals.

10. The semiconductor device according to claim 1, further comprising a verify sense amplifier configured to amplify, during write verification, a voltage of a main bit line to which information has been read, the information having been stored in the twin cell for which write operation was selected.

11. A semiconductor device comprising:

a memory array including a plurality of twin cells, each of the twin cells composed of a first storage element and a second storage element configured to hold binary data according to a difference in threshold voltage between them, the first storage element and the second storage element each being electrically rewritable; and an output circuit configured to, upon receiving a request to read the twin cell, when the threshold voltage of the first storage element forming the twin cell is lower than an erasure determination level and the threshold voltage of the second storage element forming the twin cell is lower than the erasure determination level, not read the data stored in the twin cell.

* * * * *